(12) United States Patent
Le et al.

(10) Patent No.: US 11,489,108 B2
(45) Date of Patent: Nov. 1, 2022

(54) BISB TOPOLOGICAL INSULATOR WITH SEED LAYER OR INTERLAYER TO PREVENT SB DIFFUSION AND PROMOTE BISB (012) ORIENTATION

(71) Applicant: Western Digital Technologies, Inc., San Jose, CA (US)

(72) Inventors: Quang Le, San Jose, CA (US); Cherngye Hwang, San Jose, CA (US); Brian R. York, San Jose, CA (US); Andrew Chen, San Jose, CA (US); Thao A. Nguyen, San Jose, CA (US); Yongchul Ahn, San Jose, CA (US); Xiaoyong Liu, San Jose, CA (US); Hongquan Jiang, San Jose, CA (US); Zheng Gao, San Jose, CA (US); Kuok San Ho, Emerald Hills, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 259 days.

(21) Appl. No.: 16/861,118

(22) Filed: Apr. 28, 2020

(65) Prior Publication Data
US 2021/0336127 A1  Oct. 28, 2021

(51) Int. Cl.
*H01L 29/82* (2006.01)
*H01L 43/04* (2006.01)
(Continued)

(52) U.S. Cl.
CPC ............ *H01L 43/04* (2013.01); *G11B 5/3909* (2013.01); *H01F 10/3254* (2013.01);
(Continued)

(58) Field of Classification Search
CPC ............ H01F 10/3254; H01F 10/3272; H01L 27/222; H01L 43/04; H01L 43/06;
(Continued)

(56) References Cited

U.S. PATENT DOCUMENTS 5,751,521 A    5/1998  Gill
6,657,823 B2  12/2003  Kawato
(Continued)

FOREIGN PATENT DOCUMENTS

JP        4934582 B2    5/2012
JP     2021057357 A    4/2021
(Continued)

OTHER PUBLICATIONS

U.S. Appl. No. 17/401,856, filed Aug. 13, 2021.
(Continued)

*Primary Examiner* — Samuel A Gebremariam
(74) *Attorney, Agent, or Firm* — Patterson & Sheridan, LLP; Steven H. VerSteeg

(57) ABSTRACT

A spin-orbit torque (SOT) magnetic tunnel junction (MTJ) device includes a substrate, a seed layer over the substrate, and a bismuth antimony (BiSb) layer having (0120) orientation on the seed layer. The seed layer includes a silicide layer and a surface control layer. The silicide layer includes a material of NiSi, NiFeSi, NiFeTaSi, NiCuSi, CoSi, CoFeSi, CoFeTaSi, CoCuSi, or combinations thereof. The surface control layer includes a material of NiFe, NiFeTa, NiTa, NiW, NiFeW, NiCu, NiCuM, NiFeCu, CoTa, CoFeTa, NiCoTa, Co, CoM, CoNiM, CoNi, NiSi, CoSi, NiCoSi, Cu, CuAgM, CuM, or combinations thereof, in which M is Fe, Cu, Co, Ta, Ag, Ni, Mn, Cr, V, Ti, or Si.

27 Claims, 19 Drawing Sheets

(51) Int. Cl.
   *H01L 27/22* (2006.01)
   *H01L 43/06* (2006.01)
   *H01L 43/10* (2006.01)
   *H01F 10/32* (2006.01)
   *G11B 5/39* (2006.01)
   *G11B 5/00* (2006.01)

(52) U.S. Cl.
   CPC ....... *H01F 10/3272* (2013.01); *H01L 27/222* (2013.01); *H01L 43/06* (2013.01); *H01L 43/10* (2013.01); *G11B 2005/0018* (2013.01); *G11B 2005/0032* (2013.01)

(58) Field of Classification Search
   CPC .................. H01L 43/10; G11B 5/3909; G11B 2005/0018; G11B 2005/0032
   See application file for complete search history.

(56) References Cited

U.S. PATENT DOCUMENTS

| | | |
|---|---|---|
| 6,667,861 B2 | 12/2003 | Gill |
| 6,680,828 B2 | 1/2004 | Gill |
| 6,906,898 B2 | 6/2005 | Kawato |
| 7,016,160 B2 | 3/2006 | Mao et al. |
| 7,242,556 B2 | 7/2007 | Gill |
| 7,298,595 B2 | 11/2007 | Gill |
| 7,436,632 B2 | 10/2008 | Li et al. |
| 7,643,255 B2 | 1/2010 | Gill et al. |
| 7,697,242 B2 | 4/2010 | Gill |
| 7,881,018 B2 | 2/2011 | Gill et al. |
| 8,125,746 B2 | 2/2012 | Dimitrov et al. |
| 8,174,799 B2 | 5/2012 | Hoshiya et al. |
| 8,223,464 B2 | 7/2012 | Yasui et al. |
| 8,570,689 B2 | 10/2013 | Sato et al. |
| 9,472,216 B1 | 10/2016 | Mauri et al. |
| 9,806,710 B2 | 10/2017 | Flatte |
| 9,929,210 B2 | 3/2018 | Lai et al. |
| 9,947,347 B1 | 4/2018 | Van Der Heijden et al. |
| 10,014,012 B1 | 7/2018 | Song et al. |
| 10,127,933 B2 | 11/2018 | Batra et al. |
| 10,210,888 B1 | 2/2019 | Li et al. |
| 10,483,457 B1 | 11/2019 | Lee et al. |
| 10,490,731 B2 | 11/2019 | Sasaki et al. |
| 10,720,570 B2 | 7/2020 | Le et al. |
| 10,839,831 B1 | 11/2020 | Nguyen et al. |
| 10,991,390 B2 | 4/2021 | Kobayashi |
| 11,094,338 B1 | 8/2021 | Hwang et al. |
| 11,100,946 B1 | 8/2021 | Le et al. |
| 11,222,656 B1 | 1/2022 | Le et al. |
| 2014/0226239 A1 | 8/2014 | Mihajlovic et al. |
| 2014/0254252 A1 | 9/2014 | Guo |
| 2015/0041934 A1 | 2/2015 | Khvalkovskiy et al. |
| 2015/0287426 A1 | 10/2015 | Mihajlovic et al. |
| 2017/0077392 A1 | 3/2017 | Han et al. |
| 2017/0098545 A1 | 4/2017 | Woodruff |
| 2017/0221506 A1 | 8/2017 | Tan et al. |
| 2017/0288666 A1 | 10/2017 | Flatte |
| 2018/0166500 A1 | 6/2018 | Wang et al. |
| 2018/0358543 A1 | 12/2018 | Le et al. |
| 2018/0366172 A1 | 12/2018 | Wang et al. |
| 2019/0037703 A1 | 1/2019 | Wang et al. |
| 2019/0058113 A1 | 2/2019 | Ramaswamy et al. |
| 2019/0392881 A1 | 12/2019 | Rakshit et al. |
| 2020/0279992 A1 | 9/2020 | Pham et al. |
| 2021/0056988 A1 | 2/2021 | Chen et al. |
| 2021/0249038 A1 | 8/2021 | Le et al. |
| 2021/0408370 A1 | 12/2021 | York et al. |
| 2022/0005498 A1 | 1/2022 | Le et al. |
| 2022/0013138 A1 | 1/2022 | Hwang et al. |

FOREIGN PATENT DOCUMENTS

| | | |
|---|---|---|
| WO | 2019054484 A1 | 3/2019 |
| WO | 2019125388 A1 | 6/2019 |
| WO | 2019159885 A1 | 8/2019 |

OTHER PUBLICATIONS

U.S. Appl. No. 17/405,954, filed Aug. 18, 2021.
Berry et al. "Melting at dislocations and grain boundaries: A phase field crystal study," Physical Review, vol. B 77, No. 224114, 2008, pp. 224114-1-224114-5, DOI: 10.1103/PhysRevB.77.224114.
Buffat et al. "Size effect on the melting temperature of gold particles," Physical Review A, vol. 13, No. 6, Jun. 1976, pp. 2287-2298.
Cantwell et al. "Grain boundary complexions," ScienceDirect, Acta Materialia, vol. 62, No. 152, 2014, pp. 1-48, http://dx.doi.org/10.1016/j.actamat.2013.07.037.
Eustathopoulos "Wetting by Liquid Metals-Application in Materials Processing: The Contribution of the Grenoble Group," Metals, 2015, vol. 5, No. 1, pp. 350-370, doi:10.3390/met5010350.
Frolov et al. "Structural phase transformations in metallic grain boundaries," Nature Communications, 2013, vol. 4, No. 1899, pp. 1-7, DOI: 10.1038/ncomms2919.
Kogtenkova et al. "Grain Boundary Complexions and Phase Transformations in Al- and Cu-Based Alloys," Metals, 2019, vol. 9, No. 1, doi:10.3390/met9010010, 24 pages.
Tanaka et al. "Thermodynamic Evaluation of Nano-Particle Binary Alloy Phase Diagrams," 2001, Zeitschrift für Metallkunde, vol. 92, No. 11, pp. 1236-1241, http: //hdl.handle.net/11094/26514.
Walker et al. "Composition-dependent structural transition in epitaxial Bi1-xSbx thin films on Si (111)," Physical Review Materials, vol. 3, 064201, Jun. 7, 2019, 8 pages.
International Search Report and the Written Opinion for International Application No. PCT/US2020/066902 dated Apr. 18, 2021, 12 pages.
Fan et al. "Magnetization switching through giant spin-orbit torque in a magnetically doped topological insulator heterostructure," Nature Materials, vol. 13, Apr. 28, 2014, pp. 669-704, <<https://doi.org/10.1038/nmat3973>>.
International Search Report and the Written Opinion for International Application No. PCT/US2020/065156 dated Mar. 14, 2021, 13 pages.
Roschewsky, Niklas et al.; "Spin-orbit Torque and Nernst Effect in Bi-Sb/Co Heterostructures", American Physical Society, Physical Review, B 99; https://journals.aps.org/prb/abstract/10.1103/PhysRevB.99.195103, 2019 (5 pages).
Roschewsky, Niklas et al, "Spin-Orbit Torque and Nernst Effect in BiSb/ Co Heterostructures", Center for Energy Efficient Electronics Science, https://e3s-center.berkeley.edu/wp-content/uploads/2018/11/43Theme-4_Roschewsky_2018E3Sretreat.pdf, 2018 (12 pages).
Chi, Zhendong et al.; "The Spin Hall Effect of Bi-Sb Alloys Driven by Thermally Excited Dirac-like Electronics", ArXiv: 1910, https://arxiv.org/pdf/1910.12433.pdf (40 pages).
Shirokura, Takanori et al.; "Origin of the Giant Spin Hall Effect in BISb Topological Insulator", ArXiv:1810; https://arxiv.org/ftp/arxiv/papers/1810/1810.10840.pdf (27 pages).
Qiming, Shao; "Spin-Orbit Torques in Topological Insultators", UCLA Electronic Theses and Dissertations; https://escholarship.org/content/qt3ds9792s/qt3ds9792s.pdf?t=nys1b5&nosplash=32ac004cc5750a361e60ece735dd2752; 2015 (76 pages).
Khang, Nguyen Huynh Duy et al.; "A Colossal Breakthrough for Topological Spintronics: BiSb Expands the Potential of Topological Insulators for Ultra-Low-Power Electronic Devices" Nature Materials, https://www.titech.ac.jp/english/news/2018/042001.html, 2018 (4 pages).
Yao, Kenichiro et al.; "Influence of Crystal Orientation and Surface Termination on the Growth of BiSb thin films on GaAs Substrates", Accepted Manuscript, Journal of Crystal Growth, https://www.sciencedirect.com/science/article/pii/S002202481930065X.
Khang, Nguyen Huynh Duy et al.; "A Conductive Topological Insulator with Large Spin Hall Effect for Ultralow Power Spin-Orbit Torque Switching", Nature Materials, vol. 17, http://www.nature.com/naturematerials, Sep. 2018 (7 pages).
Teague "X-ray and Mossbauer spectroscopy studies of the silicon-antimony and bismuth-antimony alloys," 1971, Scholar's Mine, Doctoral Dissertations, University of Missouri-Rolla, 167 pages.

(56) References Cited

OTHER PUBLICATIONS

"A colossal breakthrough for topological spintronics," Tokyo Institute of Technology, Jul. 31, 2018, 4 pages, <https://www.titech.ac.jp/english/news/2018/042001.html>.

International Search Report and the Written Opinion for International Application No. PCT/US2021/033912 dated Jul. 25, 2021, 9 pages.

Lau et al. "Spin-orbit torque switching without an external field using interlayer exchange coupling," Nature Nanotechnology, vol. 11, Sep. 2016, pp. 758-762, <https://doi.org/10.1038/nnano.2016.84>.

Liu "Spin-orbit Torque Driven Magnetization Switching for Nonvolatile Memory and Beyond," Carnegie Mellon University, May 2020, Thesis, 157 pages, <https://doi.org/10.1184/R1/11933571.v1>, <https://kilthub.cmu.edu/articles/Spinorbit_Torque_Driven_Magnetization_Switching_for_Nonvolatile_Memory_and_Beyond/11933571/files/21908046.pdf>.

Han et al. "Self-Biased Differential Dual Spin Valve Readers for Future Magnetic Recording," IEEE Transactions on Magnetics, vol. 48, No. 5, May 2012, pp. 1770-1776, 10.1109/TMAG.2011.2169946.

International Search Report and the Written Opinion for International Application No. PCT/US2021/033197 dated Jul. 12, 2021, 9 pages.

Kotb et al. "Study of spin transfer torque (STT) and spin orbit torque (SOT) magnetic tunnel junctions (MTJs) at advanced CMOS technology nodes," Electrical and Electronics Engineering: An International Journal, (ELELIJ) vol. 6, No. 1, Feb. 2017, pp. 1-9, 10.14810/elelij.2017.6101.

Tuan et al. "Readback Resolution of Differential Dual CPP Spin Valve Reader," IEEE Transactions on Magnetics, vol. 46, No. 6, Jun. 2010, pp. 1667-1670, 10.1109/TMAG.2010.2045106.

BISB TOPOLOGICAL INSULATOR WITH SEED LAYER OR INTERLAYER TO PREVENT SB DIFFUSION AND PROMOTE BISB (012) ORIENTATION

BACKGROUND OF THE DISCLOSURE

Field of the Disclosure

Embodiments of the present disclosure generally relate to a bismuth antimony (BiSb) topological insulator with a seed layer and/or an interlayer to prevent Sb diffusion and to promote BiSb (012) orientation.

Description of the Related Art

BiSb with (012) orientation is a narrow gap topological insulator with both giant spin Hall effect and high electrical conductivity. BiSb is a material that has been proposed in various spin-orbit torque (SOT) magnetic tunnel junction (MTJ) applications, such as for a spin Hall layer for energy-assisted magnetic recording write heads and magnetoresistive random access memory (MRAM) devices.

However, BiSb materials have not yet been adopted in commercial SOT applications due to several obstacles. For example, BiSb materials are generally soft, have low melting points, have large grain sizes, are easily damaged by ion milling, have significant Sb migration issues upon thermal annealing due to its film roughness, and have difficulty maintaining a (012) orientation for maximum spin Hall effect.

Therefore, there is a need for an improved SOT MTJ device and process including a BiSb layer with (012) orientation.

SUMMARY OF THE DISCLOSURE

Embodiments of the present disclosure generally relate to a bismuth antimony (BiSb) topological insulator with a seed layer and/or an interlayer to prevent Sb diffusion and to promote BiSb (012) orientation.

In one embodiment, a spin-orbit torque (SOT) magnetic tunnel junction (MTJ) device includes a substrate, a seed layer over the substrate, and a bismuth antimony (BiSb) layer having (012) orientation on the seed layer. The seed layer includes a silicide layer and a surface control layer. The silicide layer includes a material of NiSi, NiFeSi, NiFeTaSi, NiCuSi, CoSi, CoFeSi, CoFeTaSi, CoCuSi, or combinations thereof. The surface control layer includes a material of NiFe, NiFeTa, NiTa, NiW, NiFeW, NiCu, NiCuM, NiFeCu, CoTa, CoFeTa, NiCoTa, Co, CoM, CoNiM, CoNi, NiSi, CoSi, NiCoSi, Cu, CuAgM, CuM, or combinations thereof, in which M is Fe, Cu, Co, Ta, Ag, Ni, Mn, Cr, V, Ti, or Si.

In another embodiment, a SOT MTJ device includes a substrate and a BiSb layer with (012) orientation over a substrate. An interlayer is over the BiSb layer. The interlayer includes a silicide layer. The silicide layer includes a material of NiSi, FeSi, CoSi, NiCuSi, NiFeTaSi, CoCuSi, or combinations thereof.

In still another embodiment, a SOT MTJ device includes a substrate, a seed layer over a substrate, and a BiSb layer with (012) orientation on the amorphous film. The seed layer includes an amorphous film comprising a material with a nearest neighbor peak d-spacing matching a (111) d-spacing of an fcc lattice with an a-axis in the range of 3.54 Å to 3.78 Å or a (002) d-spacing of an hcp lattice with an a-axis in the range of 2.52 Å to 2.68 Å.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1A:
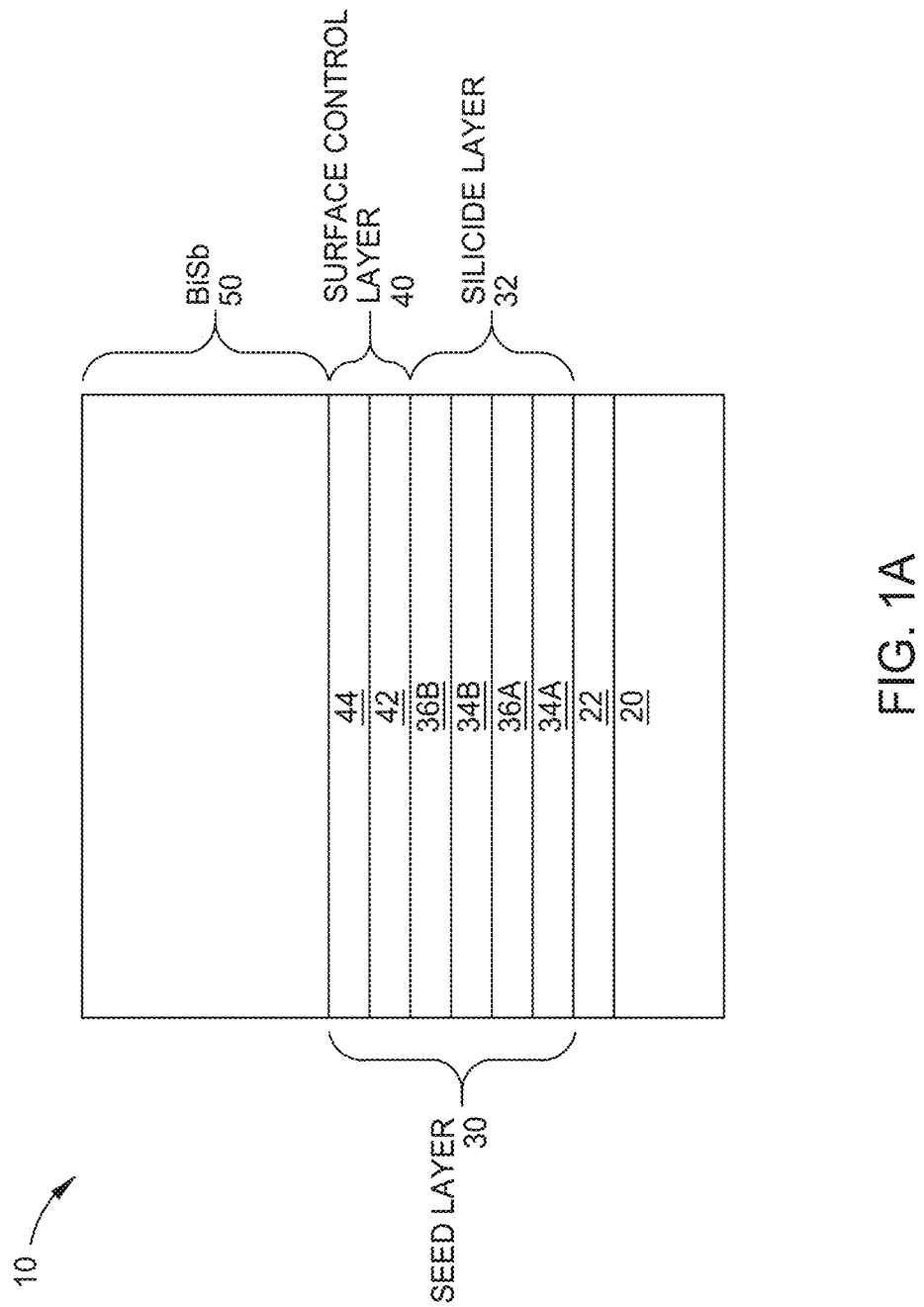
FIGS. 1A-1E are schematic cross-sectional views of certain embodiments of SOT MTJ devices having a BiSb layer with (012) orientation formed over a substrate.

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, a reference to "the disclosure" shall not be construed as a generalization of any inventive subject matter disclosed herein and shall not be considered to be an element or limitation of the appended claims except where explicitly recited in a claim(s).

Certain embodiments of the present disclosure generally relate to a seed layer that promotes the growth of a bismuth antimony (BiSb) layer with (012) orientation. A BiSb layer with (012) orientation has a large spin Hall angle effect and high electrical conductivity. A BiSb layer having (012) orientation can be used to form a spin-orbit torque (SOT) magnetic tunnel junction (MTJ) device. For example, a BiSb layer having (012) orientation can be used as a spin Hall layer in a spin-orbit torque device in an energy-assisted magnetic recording (EAMR) write head. In another example, a BiSb layer having (012) orientation can be used as a spin Hall electrode layer in a magnetoresistive random access memory (MRAM) device. In certain aspects, a seed layer provides a smooth interface for growth of a BiSb layer with (012) texture. The seed layer maintains or enhances (012) texture of the BiSb layer. In certain aspects, the seed layer acts as a barrier against Sb migration from the BiSb layer during processing, such as upon thermal annealing. In certain aspects, the seed layer maintains the conductivity of the BiSb layer to have a resistance of about 1000 uohm-cm or less. In certain aspects, the seed layer comprises a silicide layer, in which the silicide layer has a higher or a comparable resistance to the BiSb layer so that current does not shunt from the BiSb through the seed layer.

Certain embodiments of the present disclosure generally relate to an interlayer that maintains a BiSb layer with (012) orientation. A BiSb layer with (012) orientation has a large spin Hall angle effect and high electrical conductivity. A BiSb layer having (012) orientation can be used to form a spin-orbit torque (SOT) magnetic tunnel junction (MTJ) device. For example, a BiSb layer having (012) orientation can be used as a spin Hall layer in a spin-orbit torque device in an energy-assisted magnetic recording (EAMR) write head. In another example, a BiSb layer having (012) orientation can be used as a spin Hall electrode layer in a magnetoresistive random access memory (MRAM) device. In certain aspects, an interlayer provides a smooth interface over a BiSb layer with (012) texture. The interlayer maintains or enhances (012) texture of the BiSb layer. In certain aspects, the interlayer acts as a barrier against Sb migration from the BiSb layer during processing, such as upon thermal annealing. In certain aspects, the interlayer maintains the conductivity of the BiSb layer to have a resistance of about 1000 uohm-cm or less. In certain aspects, the interlayer layer comprises a silicide layer, in which the silicide layer has a higher or a comparable resistance to the BiSb layer so that current does not shunt from the BiSb through the interlayer.

FIG. 1A is a schematic cross-sectional view of certain embodiments of a SOT MTJ device 10 having a BiSb layer 50 with (012) orientation formed over a substrate 20. The substrate 20 can be a silicon substrate, an alumina substrate, or other suitable substrates. The substrate 20 can include one or more layers deposited on and/or formed thereover. For example, substrate 20 can include an oxide layer thermally grown or deposited thereover.

In certain embodiments, a base layer 22 is deposited over the substrate 20. In certain embodiments, the base layer 22 comprises a silicon layer. In certain embodiments, the silicon layer is undoped. In certain embodiments, the silicon layer is doped (such as n-doped or p-doped) to adjust the conductivity of the base layer 22. In certain embodiments, the silicon layer has a thickness from about 1 Å to about 30 Å. In certain embodiments, the base layer 22 comprises a metal layer comprising NiM, CoM, NiFeM, CoCuM, NiCuM, NiFeTaM, or combinations thereof, in which M is selected from a group consisting of Fe, Cu, Co, Ta, Ag, Ni, Mn, Cr, V, Ti, or Si. In certain embodiments, the base layer 22 comprises a silicon layer and a metal layer. The metal layer can increase the conductivity of the silicon layer. For example, the base layer 22 can comprise a metal layer between the silicon layer and the substrate 20. The metal layer in contact with a silicon layer or with a silicon substrate 20 will form an amorphous, smooth silicide layer which is nonmagnetic to temperature about 300° C. or less. In certain embodiments, the SOT MTJ device 10 excludes the base layer 22.

A seed layer 30 is deposited over the substrate 20, such as on the base layer 22 or on the substrate 20. The seed layer 30 comprises a silicide layer 32. In certain embodiments, the silicide layer 32 comprises NiSi, NiFeSi, NiFeTaSi, NiCuSi, CoSi, CoFeSi, CoFeTaSi, CoCuSi, or combinations thereof. In certain embodiments, the silicide layer 32 has a thickness from about 1 Å to about 30 Å. In certain embodiments, the silicide layer 32 comprises one or more stacks of a laminate comprising a silicon layer 34 and a metal layer 36. One stack of a laminate comprising a silicon layer 34A and a metal layer 36A is shown in FIG. 1A. Alternating silicon layer 34 and metal layer 36 will intermix and form a thin nanocrystalline silicide layer at room temperature. As used herein room temperature is defined as a temperature from about 15° C. to about 25° C. In certain embodiments, the silicide layer 32 comprises a metal layer 36 intermixing with the silicon substrate 20 at room temperature to form a thin nanocrystalline layer. The nanocrystalline silicide layer is stable (remains nanocrystalline, smooth and high resistivity) at temperatures of about 300° C. or below. In certain embodiments, the metal layer 36 comprises Ni, NiFe, NiFeTa, NiCu, Co, CoFe, CoFeTa, CoCu, or combinations thereof. In certain embodiments, the silicide layer comprises from one to four stacks of a laminate of a silicon layer 34 and a metal layer 36.

Figure 11:
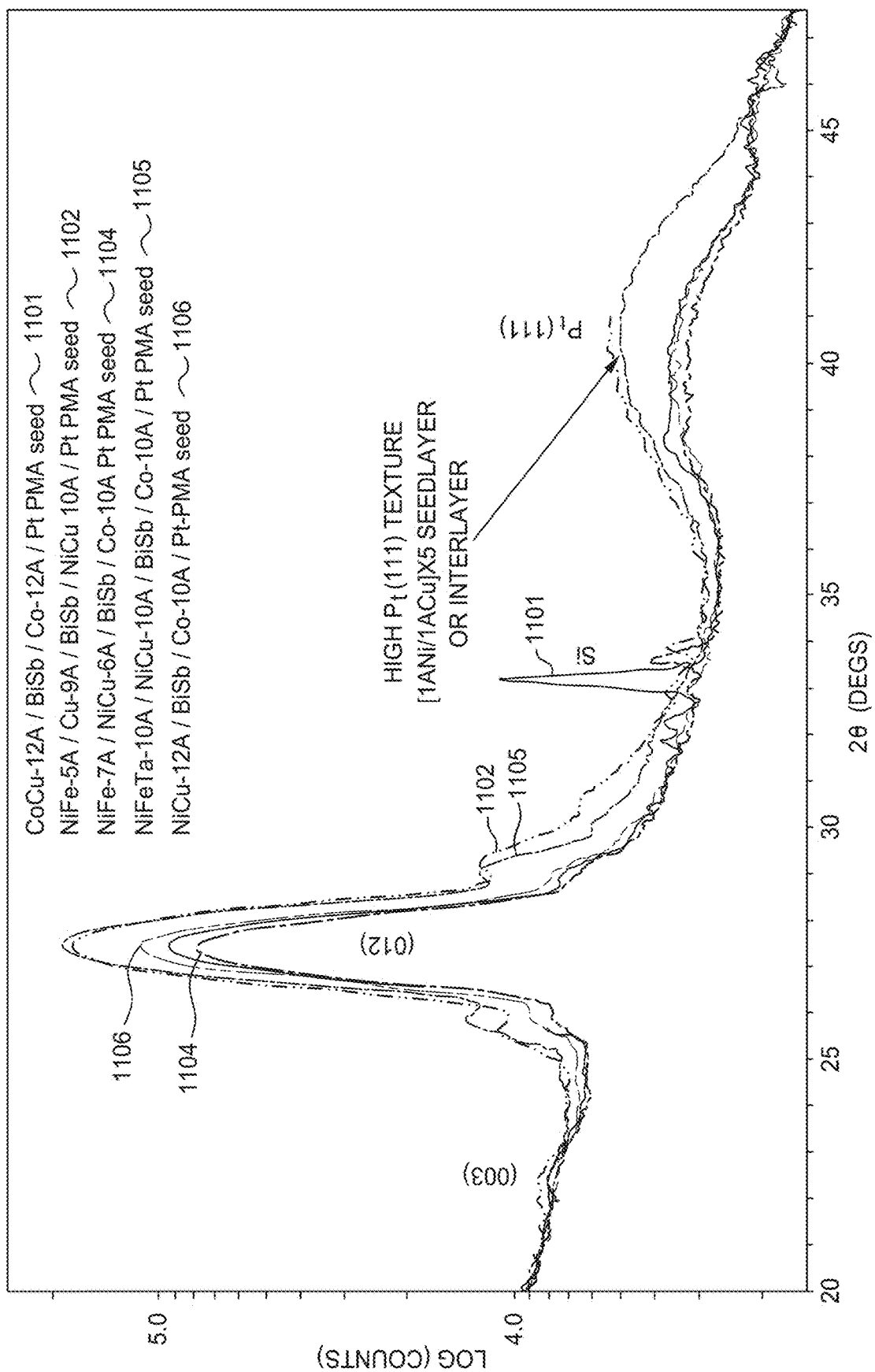
FIGS. 11 and 12 illustrate X-ray diffraction (XRD) 2Θ scans of samples comprising a BiSb layer with (012) orientation.
Figure 12:
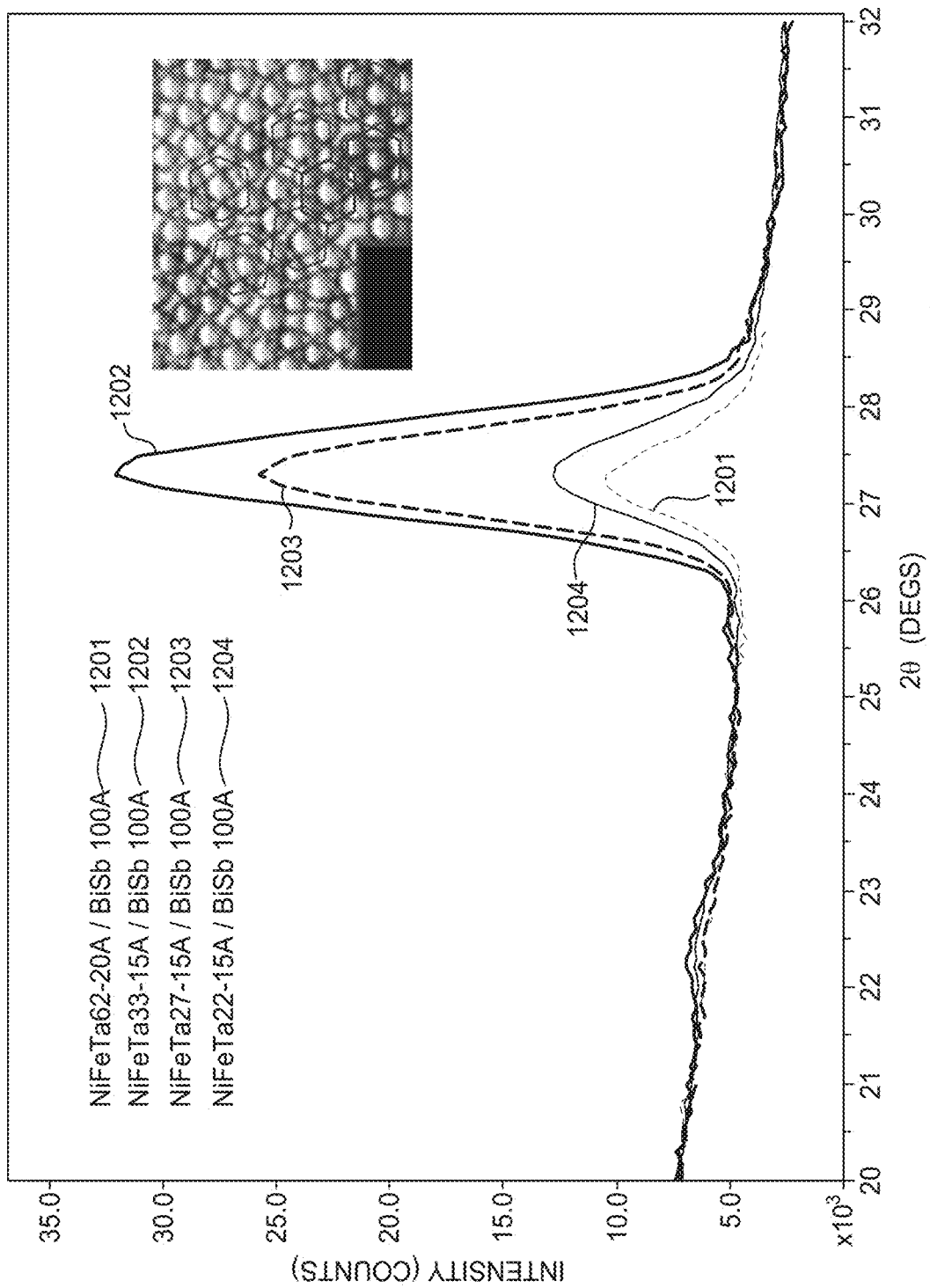
Figure 13:
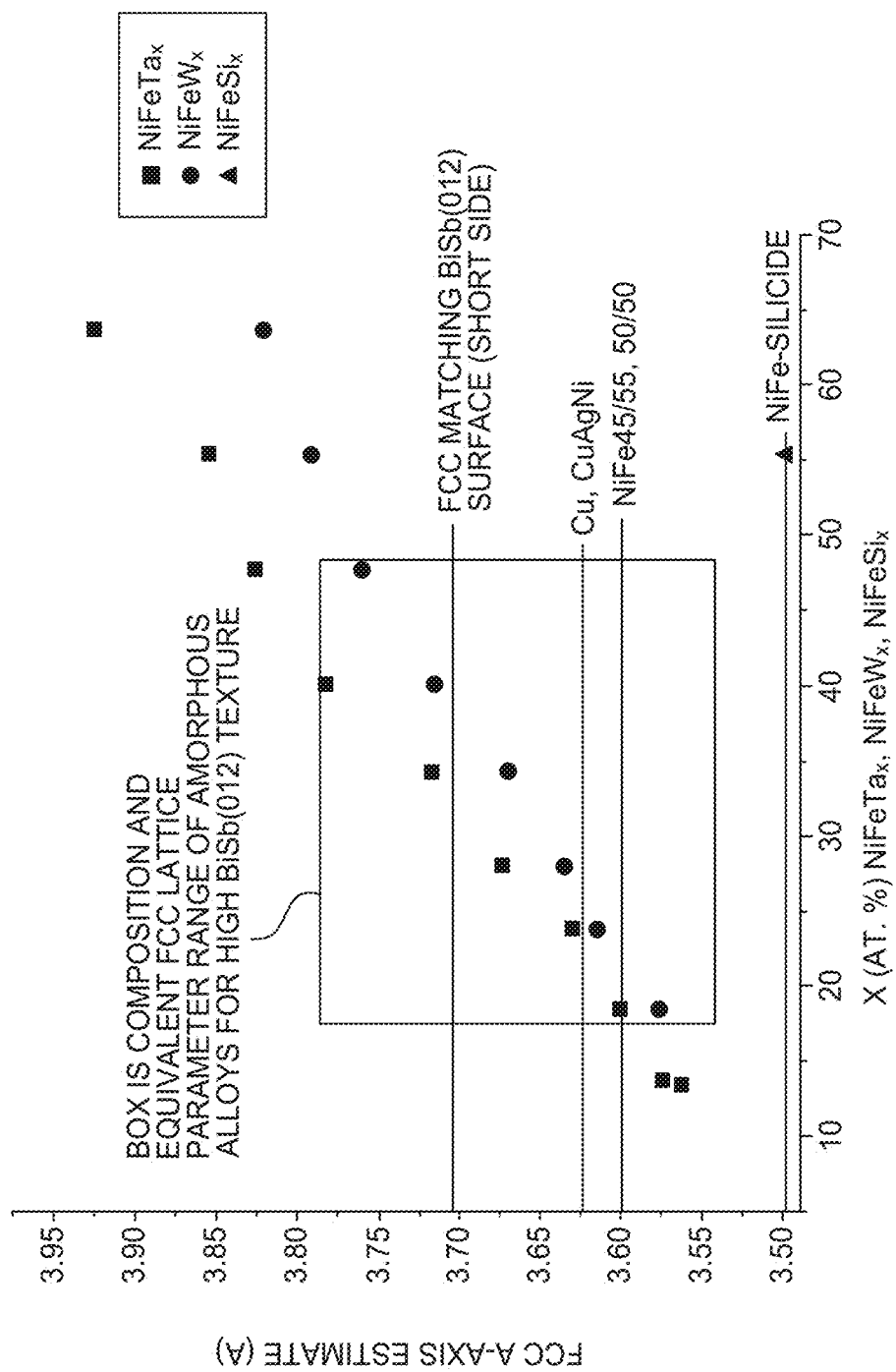
FIGS. 13 and 14 show plots of amorphous peak lattice spacing plotted versus composition of various metal alloys.

In certain embodiments, the seed layer 30 comprises an amorphous film with a nearest neighbor peak d-spacing matching a (111) d-spacing of an fcc lattice with an a-axis in the range of 3.54 Å to 3.78 Å or with a (002) d-spacing of an hcp lattice with an a-axis in the range of 2.52 Å to 2.68 Å. In certain aspects, an amorphous film can be represented by a large population of local hexagonal lattices, in which the nearest neighbor peak is from a large population of local fcc (111) surfaces and attributed to a (111) fcc d-spacing. Hence, any amorphous or near amorphous-nanocrystalline material with a nearest neighbor peak d-spacing matching a (111) d-spacing of an fcc lattice with an a-axis in the range of 3.54 Å to 3.78 Å or with a (002) d-spacing of an hcp lattice with an a-axis in the range of 2.52 Å to 2.68 Å can be used to promote strong BiSb (012) texture. FIG. 11 shows XRD scans of metal layer 36 comprising of NiFeTa$_x$ and NiFeW$_x$. The vertical line indicates fcc (111) d-spacing for NiFeTa and NiFeW$_x$, which support strong BiSb (012) texture. FIG. 12 shows amorphous NiFeTa seed composition scan of BiSb (012) texture where the Ta composition matches expected value based on the measured lattice parameter of an approximate rectangular surface (short 'a' side) of the amorphous alloy which supports strong BiSb (012) texture. Moreover, FIG. 13 shows a plot of amorphous peak lattice spacing converted into an fcc a-axis and plotted versus composition of alloying element (NiFe)$_{(1-x)}$ M$_x$ for M=Ta, W, Si. The rectangular box indicates the lattice parameter range for amorphous alloys to have and produce strong (012) BiSb texture, along with composition range for NiFeM amorphous alloys where M=Ta, W, Si. For alloying element (NiFe)(1-x)M$_x$ for x=Ta, W within the rectangle box, the lattice parameter range to match BiSb and produce strong (012) BiSb texture for NiFeTa is 22<x<43, such as 32<x<37, and for NiFeW is 19<x<40, such as 28<x<40. As shown, the NiFeSi lattice parameter isn't in the range to directly promote strong BiSb (012) texture. However, when used with a (111) fcc or (002) hcp textured surface control layer which is in the range, such as Cu, CuAgNi, then the silicide promotes strong BiSb (012) texture, with better control of BiSb growth and interfacial roughness.

In certain embodiments, the seed layer 30 further comprises a surface control layer 40 between the silicide layer 32 and the BiSb layer 50. In certain embodiments, the surface control layer 40 comprises NiFe, NiFeTa, NiTa, NiW, NiFeW, NiCu, NiFeCu, CoTa, CoFeTa, NiCoTa, Co, CoM, CoNiM, CoNi, NiSi, CoSi, NiCoSi, Cu, CuAg, CuAgM, CuM, or combinations thereof, in which M is Fe, Cu, Co, Ta, Ag, Ni, Mn, Cr, V, Ti, or Si. In certain embodiments, the surface control layer has a thickness from about 1 Å to about 20 Å. In certain embodiments, the surface control layer 40 comprises a first layer over the silicide layer 32 and comprises a second layer over the first layer. The first layer comprises NiFe, NiFeTa, NiTa, NiW, NiFeW, NiCu, NiCuAg, NiCuM, NiFeCu, CoTa, CoFeTa, NiCoTa, Co, CoCu, or combinations thereof, in which M is Fe, Cu, Co, Ta, Ag, Ni, Mn, Cr, V, Ti, or Si. The second layer comprises CoNi, NiSi, CoSi, NiCoSi, CuAgNi, CuM, CuNiM, Ni, CoCu, Cu, Co, NiCu, or combinations thereof, in which M is Fe, Cu, Co, Ta, Ag, Ni, Mn, Cr, V, Ti, or Si.

The seed layer 30 helps to provide growth of the BiSb layer 50 with (012) orientation. In certain embodiments, the thin silicide layer 32 is formed by direct contact of silicon layer(s) 34 and metal layer(s) 36 at room temperature through metal and silicon migration. The silicide layer is nanocrystalline or amorphous with reduced surface roughness. The silicide layer has moderately high resistivity of greater than about 200 uohm-cm. The silicide is nonmagnetic and stable (remains nanocrystalline, smooth, high resistivity, and nonmagnetic) at temperatures of about 300° C. or less. The silicide layer 32 with a nanocrystalline structure has hexagonal local symmetry which enhances BiSb growth with (012) orientation.

A crystalline nickel or cobalt di-silicide layer with a nanocrystalline structure has hexagonal local symmetry with an $a_{hcp}$ dimension of about 3.830 Å and 3.793 Å respectively. The $a_{hcp}$ dimension of the silicide layer is about 1.5 times the $a_{hcp}$ dimension of the surface control layer 40, but will strongly overlay the lattice of the control layer 40 and also be used as seed layer to promote strong BiSb (012) growth.

The surface control layer 40 has an fcc(111) or an hcp(002) surface. In certain embodiments, the surface control layer 40 comprises one or more hcp materials with a (002) orientation with an $a_{hcp}$ dimension from about 2.49 Å to about 2.62 Å, which surprisingly provides growth of a BiSb layer with (012) orientation. For example, NiFe has an $a_{hcp}$ dimension of about 2.54 Å.

In certain embodiments, the surface control layer 40 comprises one or more fcc materials with a (111) orientation with an a-axis dimension from about 3.52 Å to about 3.71 Å, which surprisingly provides growth of a BiSb layer with (012) orientation. For example, NiFe with an fcc(111) orientation has an a-axis dimension of about 3.59 Å.

Figure 14:
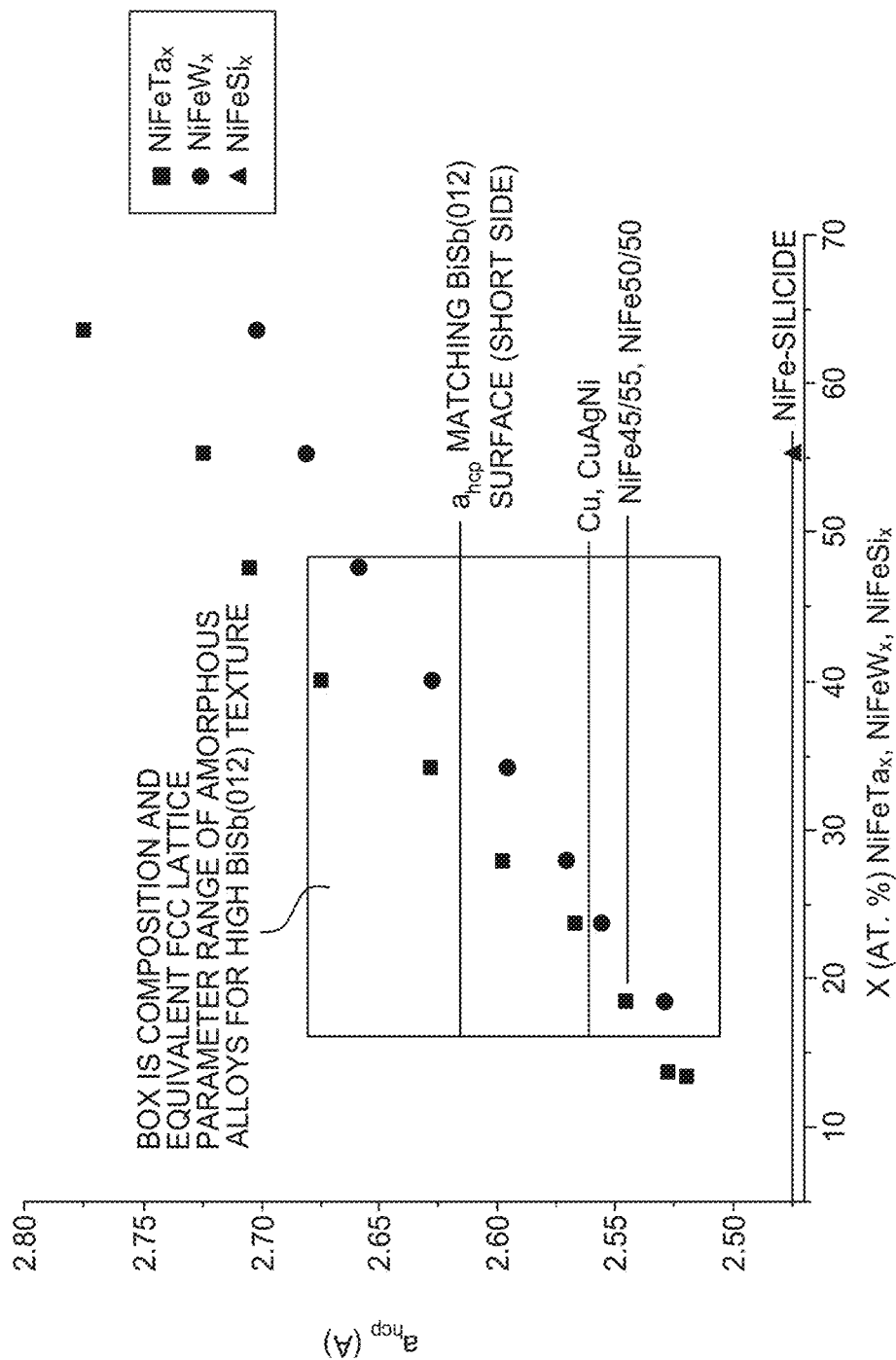

FIG. 14 shows the same plot except an fcc has been replaced by an hcp lattice (sqrt2 factor). For amorphous silicide with lattice parameter outside the range, like NiFeSi, would not directly promote BiSb (012) texture, but when used with an fcc or hcp textured surface control layer that is in the range can produce strong BiSb (012) texture. One example of an amorphous silicide used with a (111) fcc or a (002) hcp textured surface control layer which is in the range to promote BiSb (012) growth is a NiFe-silicide formed in a range from about 8 Å to about 30 Å and a surface control layer of Cu or CuAgNi formed to a thickness of from about 2 Å to about 5 Å.

The seed layer 30 surprisingly provides growth of a BiSb layer 50 with (012) orientation. The BiSb layer 50 comprises $Bi_{1-x}Sb_x$ wherein x is 0<x<1. In certain embodiments, the BiSb layer 50 comprises $Bi_{1-x}Sb_x$ wherein x is 0.05<x<0.2 or comprises antimony in an atomic percent content from about 7% to about 22%. In certain embodiments, the BiSb layer 50 is formed to a thickness from about 20 Å to about 200 Å, such as from about 50 Å to about 150 Å.

TABLE 1 shows one example of the properties of a BiSb layer with (012) orientation in comparison to beta-tantalum and to a BiSb layer with (001) orientation.

TABLE 1

|  | Spin Hall angle $\theta_{SH}$ | conductivity $\sigma$ ($10^6$ $\Omega^{-1}$ m$^{-1}$) | Power (relative) |
| --- | --- | --- | --- |
| Beta-Ta | −0.15 | 0.52 | 1 |
| BiSb (001) | 11 | 0.25 | $3.9 \times 10^{-04}$ |
| BiSb (012) | 52 | 0.25 | $1.7 \times 10^{-05}$ |

A BiSb layer with (012) orientation has similar electrical conductivity and a much larger spin Hall angle than beta-tantalum (Beta-Ta) or a BiSb layer with (001) orientation. Therefore, the relative power required to produce a spin Hall effect is lower for BiSb (012) in comparison to Beta-Ta or BiSb (001).

In certain embodiments, the silicon base layer 22 (if any), the seed layer 30, and the BiSb layer 50 are deposited by physical vapor deposition (PVD), such as sputtering, molecular beam epitaxy, ion beam deposition, other suitable PVD processes, or combinations thereof. The SOT MTJ device 10 includes any suitable layers over the BiSb layer 50 to form any suitable device.

Figure 1B:
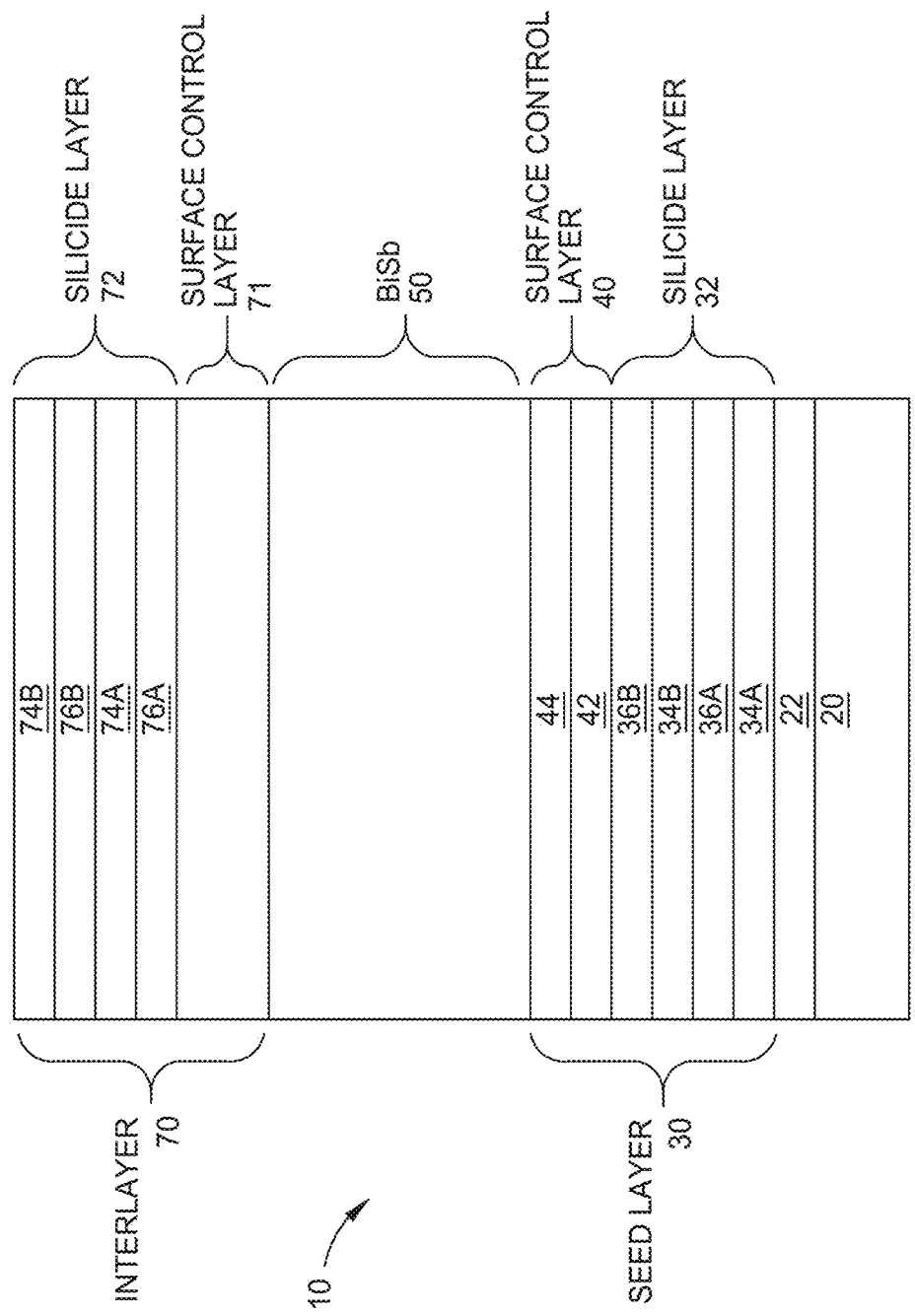

FIG. 1B is a schematic cross-sectional view of certain embodiments of the SOT MTJ device 10 having a BiSb layer 50 with (012) orientation of FIG. 1A, with an interlayer 70 deposited over the BiSb layer 50.

Figure 1C:
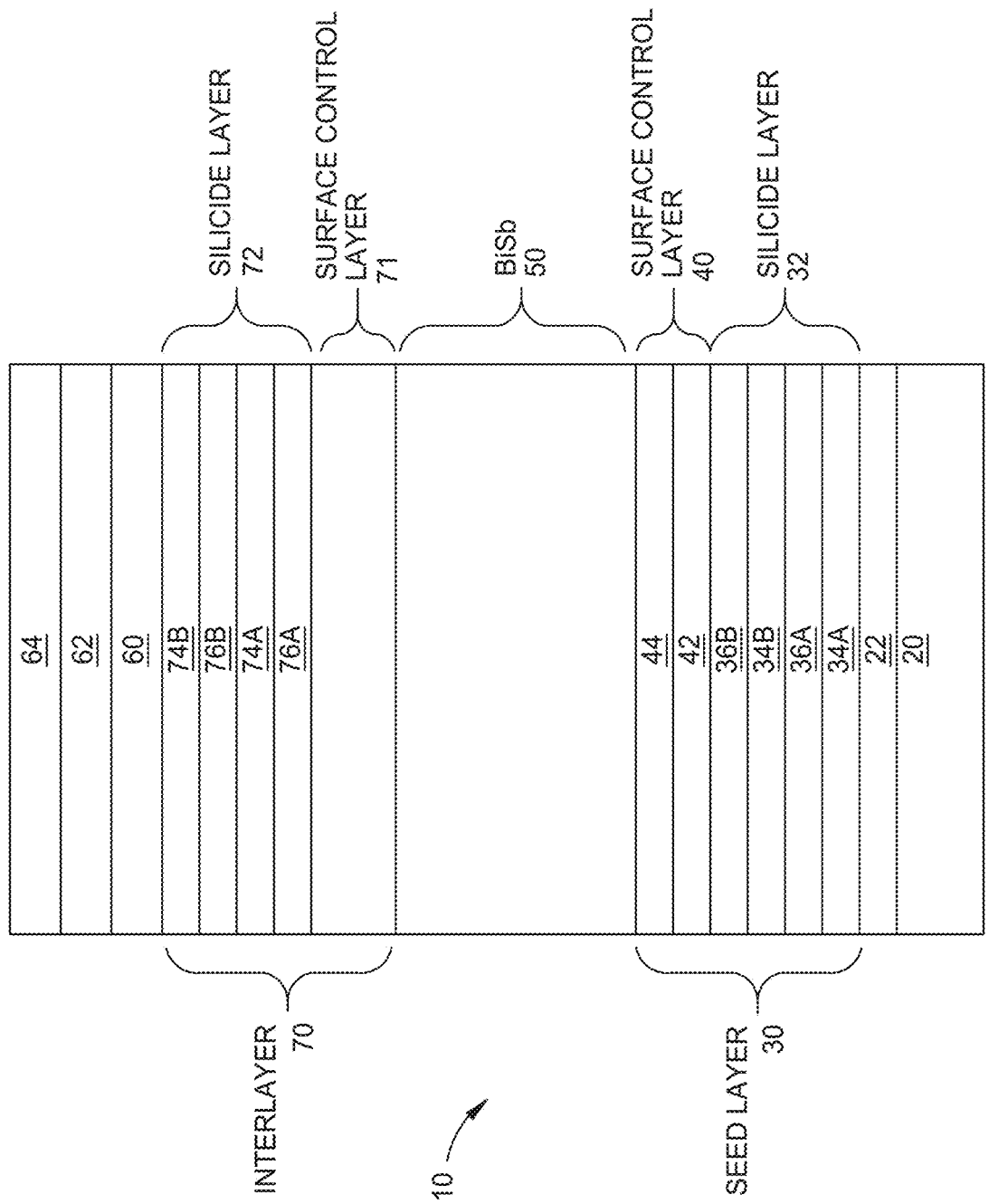

The interlayer 70 comprises a silicide layer 72. In certain embodiments, the silicide layer 72 comprises NiSi, FeSi, CoSi, NiCuSi, NiFeTaSi, CoFeSi, CoCuSi, or combinations thereof. In certain embodiments, the silicide layer 72 has a thickness from about 1 Å to about 180 Å. In certain embodiments, the silicide layer 72 comprises one or more stacks of a laminate comprising a silicon layer 74 and a metal layer 76. One stack of a laminate comprising a silicon layer 74A and a metal layer 76A is shown in FIG. 1C. In certain embodiments, the metal layer 76 comprises Ni, Fe, Co, NiCu, NiFeTa, CoFe, CoCu, or combinations thereof. In certain embodiments, the silicide layer comprises from one to four stacks of a laminate of a silicon layer 74 and a metal layer 76.

In certain embodiments, the interlayer 70 comprises an amorphous film with a nearest neighbor peak d-spacing matching a (111) d-spacing of an fcc lattice with an a-axis in the range of 3.54 Å to 3.78 Å or with a (002) d-spacing of an hcp lattice with an a-axis in the range of 2.52 Å to 2.68 Å. If certain aspects, the amorphous film can be represented by a large population of local hexagonal lattices, in which the nearest neighbor peak is from a large population of local fcc (111) surfaces and attributed to a (111) fcc d-spacing. Hence, any amorphous or near amorphous-nanocrystalline material with a nearest neighbor peak d-spacing matching a (111) d-spacing of an fcc lattice with an a-axis in the range of 3.54 Å to 3.78 Å or with a (002) d-spacing of an hcp lattice with an a-axis in the range of 2.52 Å to 2.68 Å can be used to promote a strong BiSb (012) texture. FIG. 11 shows XRD scans of metal layer 36 comprising of NiFeTa and NiFeW$_x$. The vertical line indicates fcc (111) d-spacing for NiFeTa and NiFeW$_x$, which support strong BiSb (012) texture. FIG. 12 shows amorphous NiFeTa seed composition scan of BiSb (012) texture where the Ta composition matches expected value based on the measured lattice parameter of an approximate rectangular surface (short 'a' side) of the amorphous alloy which supports strong BiSb (012) texture. Moreover, FIG. 13 shows a plot of amorphous peak lattice spacing converted into an fcc a-axis and plotted versus composition of alloying element (NiFe)$_{(1-x)}$M$_x$ for M=Ta, W, Si. The rectangular box indicates the lattice parameter range for amorphous alloys to have and produce strong (012) BiSb texture, along with composition range for NiFeM amorphous alloys where M=Ta, W, Si. For alloying element (NiFe)(1-x)M$_x$ for M=Ta, W within the rectangle box, the lattice parameter range to match BiSb and produce strong (012) BiSb texture for NiFeTa$_x$ is 22<x<43, such as 32<x<37 and for NiFeW$_x$ is 19<x<40, such as 28<x<40. As shown, the NiFeSi lattice parameter isn't in the range to directly promote strong BiSb (012) texture. However, when used with a surface control layer such as Cu, CuAgNi, then the silicide promotes strong BiSb (012) texture.

In certain embodiments, the interlayer 70 further comprises a surface control layer 71 between the BiSb layer 50 and the silicide layer 72. The surface control layer 71 comprises Cu, Ni, NiFe, Co, or combinations thereof. In certain embodiments, the thickness of the surface control layer 71 is from about 1 Å to 10 Å. In certain embodiments, each of the surface control layer 40, 71 of FIGS. 1A-1B can be used to improve smoothness and reduce Sb migration of the BiSb layer 50.

FIG. 14 shows the same plot except an fcc has been replaced by an hcp (sqrt2 factor). For amorphous silicide with lattice parameter outside the range, like NiFeSi, would not directly promote BiSb (012) texture, but when used with a (111) fcc or (002) hcp textured surface control layer that is in the range, then the silicide can promote strong BiSb (012) texture. One example of an amorphous silicide used with a (111) fcc or a (002) hcp textured surface control layer in the range to promote BiSb (012) growth is an NiFe-silicide formed to a thickness in a range from about 8 Å to about 30 Å and a surface control layer of Cu or CuAgNi formed to a thickness of from about 2 Å to about 5 Å.

FIG. 1C is a schematic cross-sectional view of certain embodiments of the SOT MTJ device 10 having a BiSb layer 50 with (012) orientation of FIG. 1B forming an SOT-based energy assisted magnetic recording (EAMR) element. A spin torque layer (STL) 60 is formed over the interlayer 70. The STL 60 comprises a ferromagnetic material such as one or more layers of CoFe, CoIr, NiFe, and CoFeM wherein M=B, Ta, Re, or Ir. Charge current through a BiSb layer 50 acting as a spin Hall layer generates a spin current in the BiSb layer. The spin orbital coupling of the BiSb layer and a spin torque layer (STL) 60 causes switching or precession of magnetization of the STL 60 by the spin orbital coupling of the spin current from the BiSb layer 50. Switching or precession of the magnetization of the STL 60 can generate an assisting DC field to the write field. SOT based EAMR elements have multiple times greater power efficiency in comparison to spin transfer torque (STT) based Microwave Assisted Magnetic Recording (MAMR) elements.

In certain embodiments, additional layers are formed over the STL 60 such as a spacer layer 62 and a pinning layer 64. The pinning layer 64 can partially pin the STL 60. The pinning layer 64 comprises a single or multiple layers of PtMn, NiMn, IrMn, IrMnCr, CrMnPt, FeMn, other antiferromagnetic materials, or combinations thereof. The spacer layer 62 comprises single or multiple layers of magnesium oxide, aluminum oxide, other non-magnetic materials, or combinations thereof.

Figure 1D:
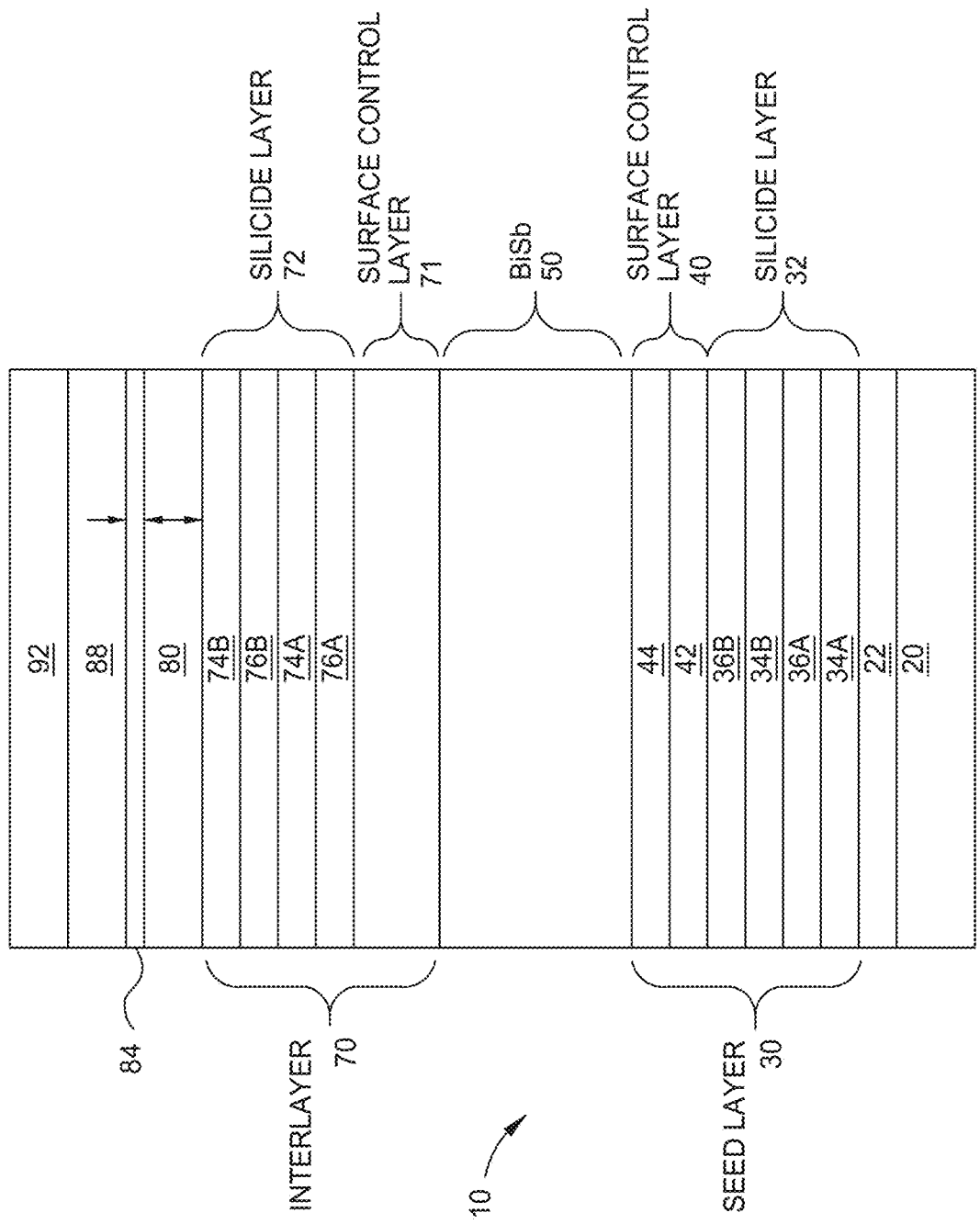

FIG. 1D is a schematic cross-sectional view of certain embodiments of the SOT MTJ device 10 having a BiSb layer 50 with (012) orientation of FIG. 1C forming a SOT-based magnetoresistive random access memory (MRAM) device. A free perpendicular magnetic anisotropy (PMA) ferromagnetic layer 80 is formed over the interlayer 70. For example, the free PMA ferromagnetic layer 80 can comprise one or more stacks of a Co/Pt, Co/Pd, Co/Ni, CoFeB, FePt, other PMA inducing layers, or combinations thereof. An insulating layer 84, such as a MgO layer, is formed over the free PMA layer 80. A reference PMA ferromagnetic layer 88 is formed over the insulating layer 84. The reference PMA ferromagnetic layer 88 can comprise one or more stacks of a Co/Pt, Co/Pd, Co/Ni, CoFeB, FePt, other PMA inducing layers, or combinations thereof. The reference PMA ferromagnetic layer 88 can include one or more synthetic antiferromagnetic (SAF) pinned structures. A capping layer 92 can be formed over the reference PMA layer 88. The capping layer 92 comprises NiFe, SiN, Si, NiFeTa, NiTa, Pt, Co, Cu, Ni, NiCu, CoCu, Ru, Ta, Cr, Au, Rh, CoFe CoFeB, other non-magnetic materials, other magnetic materials, or combinations thereof. The capping layer 92 can be adjusted to have a higher resistance than the PMA layer 88 so that current does not shunt from the PMA layer 88 through the capping layer 92 and protect the SOT MTJ device 10 during deposition, annealing, patterning, cleaning, etc.

Figure 1E:
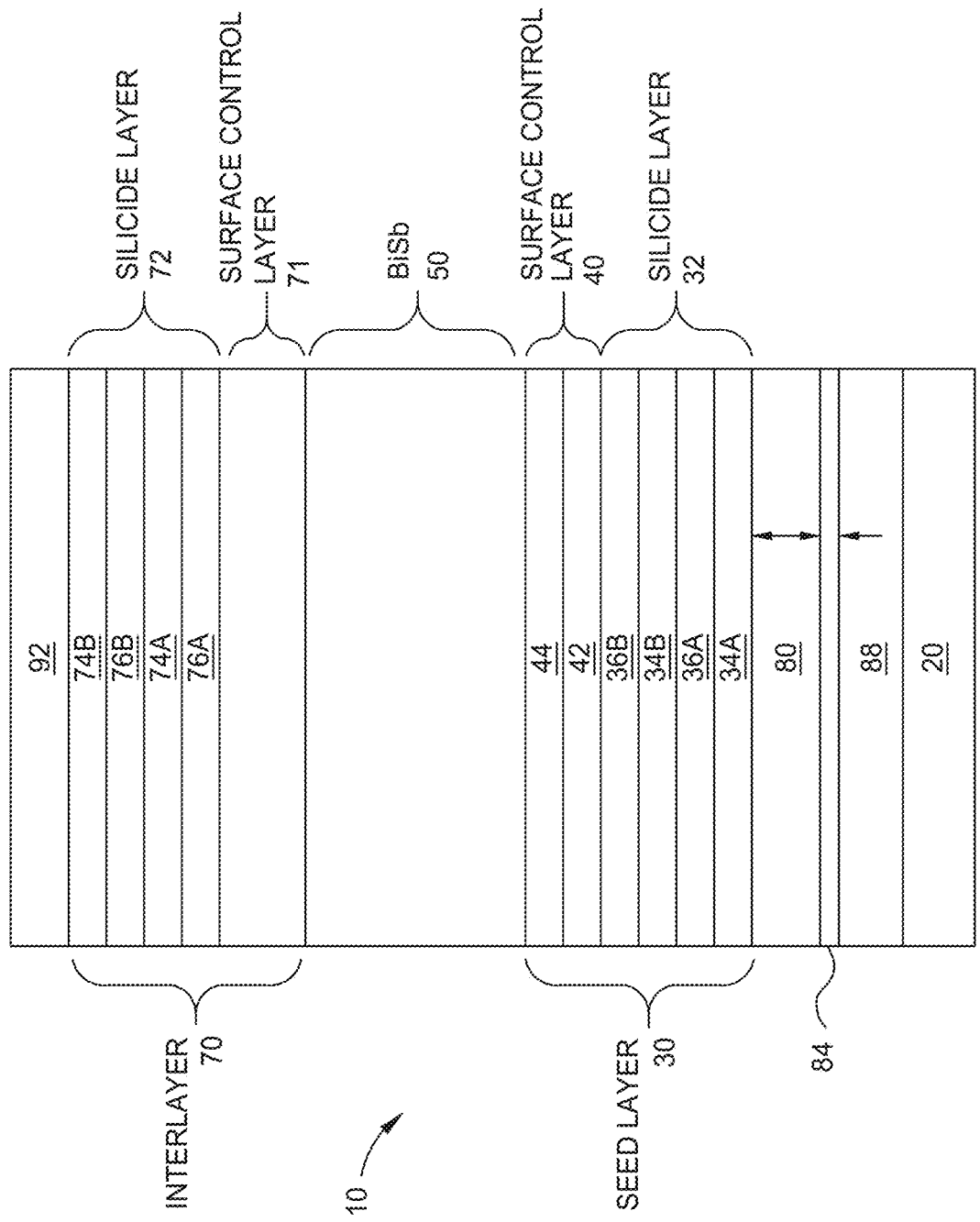

FIG. 1E is a schematic cross-sectional view of certain embodiments of the SOT MTJ device 10 having a BiSb layer 50 with (012) orientation of FIG. 1C forming a SOT-based magnetoresistive random access memory (MRAM) device. The reference PMA ferromagnetic layer 88 is formed over the substrate 20. The reference PMA ferromagnetic layer 88 can comprise one or more stacks of a Co/Pt, Co/Pd, Co/Ni, CoFeB, FePt, other PMA inducing layers, or combinations thereof. The reference PMA ferromagnetic layer 88 can include one or more SAF pinned structures. An insulating layer 84, such as an MgO layer, is formed over the reference PMA ferromagnetic layer 88. A free PMA ferromagnetic layer 80 is formed over the insulating layer 84. For example, the free PMA ferromagnetic layer 80 can comprise one or more stacks of a Co/Pt, Co/Pd, Co/Ni, CoFeB, FePt, other PMA inducing layers, or combinations thereof.

The seed layer 30 is formed over the free PMA ferromagnetic layer 80. The BiSb layer 50 is formed over the seed layer 30. The interlayer 70 is formed over the BiSb layer 50.

A capping layer 92 can be formed over the interlayer 70. The capping layer 92 comprises NiFe, SiN, Si, NiFeTa, NiTa, Pt, Co, Cu, Ni, NiCu, CoCu, Ru, Ta, Cr, Au, Rh, CoFe CoFeB, other non-magnetic materials, other magnetic materials, or combinations thereof. The capping layer 92 can be adjusted to have a higher resistance than the PMA layer 88 so that current does not shunt from the PMA layer 88 through the capping layer 92 and protect the SOT MTJ device 10 during deposition, annealing, patterning, cleaning, etc.

The silicide layer 32 of the seed layer 30 or the silicide layer 72 of the interlayer 70 of FIGS. 1A-1E can be formed by co-sputtering Si with a metal (such as Ni, Fe, Co, etc.) or can be formed by laminating Si with a metal to produce a silicide. The silicide layer 32, 72 can be further thermally annealed. The silicide layer 32, 72 has a resistivity higher than the BiSb layer 50 so that current is not shunted through the silicide layer from the BiSb layer. In certain embodiments, the silicide layer has a resistivity of greater than about 200 uohm-cm.

The silicide layer 32 of the seed layer 30 of FIGS. 1A-1E and/or the silicide layer 72 of the interlayer 70 of FIGS. 1C-D act as a barrier to reduce Sb migration from the BiSb layer 50. Migration of Sb from the BiSb layer 50 may undesirably reduce the spin Hall angle, alter the orientation of the BiSb layer 50 with (012) orientation, and/or, reduce the conductivity of the BiSb layer 50.

In certain aspects, the silicide layer 32 and/or the silicide layer 72 reduce shunting of the BiSb layer 50 by providing higher resistance layer proximate the conductive BiSb layer 50 in comparison to a seed layer or interlayer consisting of a metal, metal alloy, or other non-silicide material. Increased resistance of the seed layer 30 and/or the interlayer 70 can reduce electrically shunting of current from the BiSb layer 50 through the seed layer 30 and/or the interlayer 70. Electrically shutting of current would reduce the performance of the SOT MTJ device, such as a SOT-based EAMR device or a SOT-based MRAM device.

TABLE 2 shows examples of the resistivity of a silicide layer in comparison to metal layers. For example, a NiFe/Si laminated film has a resistivity from about 240 μohm-cm to about 350 μohm-cm, depending on the number of stacks of a laminated film. The silicide layers, such as NiFe/Si, NiFeTa/Si, Co/Si, Ni/Si, Cu/Si, NiCu/Si, CoCu/Si, CoFe/Si, and other silicides, have higher resistivity than a metal layer alone.

TABLE 2

| Laminated Film | # of Stacks | resistivity (μohm-cm) |
| --- | --- | --- |
| NiFe 5 Å/Si 10 Å | 8x | 340 |
| NiFe 10 Å/Si 5 Å | 8x | 280 |
| NiFe 2 Å/Si 14 Å/Cu 2 Å/NiFe 7 Å | 5x | 244 |
| NiFe 3Å/Si 18 Å/Cu 2 Å/NiFe 7 Å | 5x | 257 |
| NiFe 4Å/Si 22 Å/Cu 2 Å/NiFe 7 Å | 5x | 295 |
| Si 12 Å/NiFe 6 Å | 5x | 272 |
| Si 14 Å/NiFe 7 Å | 5x | 311 |
| Si 16 Å/NiFe 8 Å | 5x | 36 |
| NiCu (50/50 composition) | 1x | 50 |
| CoCu (50/50 composition) | 1x | 38 |
| CuAg5Ni10 (85/5/10 composition) | 1x | 11 |
| NiFeTa27/NiTa43 (composition) | 1x | 170 |
| NiFeTa/Si | | >300 |
| BiSb | | 600 to 1000 |
| NiFe | | 20 |
| Cu | | 2 |
| Co | | 6 |
| Pt | | 11 |

In certain aspects, the silicide layer 32 provides a smooth interface for the growth of a surface control layer 40 for growth of a BiSb layer 50 with (012) orientation. In certain aspects, the silicide layer 72 provides a smooth interface for the growth of materials thereover. These smooth interfaces reduce the migration of Sb from the BiSb layer 50 which occurs due to roughness between interfaces. In certain embodiments, the silicide layer 32 or the silicide layer 72 comprising laminations with a thickness ratio of a silicon layer and a metal layer of about 2:1 range produced or maintained a BiSb layer 50 with (012) texture with low roughness. For example, a Si 4 Å/NiFe 2 Å to a Si 16 Å/NiFe 8 Å lamination stack produced or maintained a BiSb layer 50 with (012) texture with low roughness.

In certain embodiments, the surface control layer 71 of the interlayer 70 of FIGS. 1B-1E aids in reducing Sb migration from the BiSb layer 50 and improving interface smoothness.

In certain embodiments, the surface control layer 71 can improving texture and magnetic anisotropy of magnetic layers formed thereover, such as PMA layers formed thereover in FIGS. 1D-1E. In certain embodiments, the surface control layer 71 can be used as a spacer to adjust the resistivity so that current does not shunt from the BiSb layer 50 through the PMA layers formed thereover in FIG. 1D. In certain embodiments, the interlayer 70 of FIGS. 1B-1E excludes a surface control layer.

Figure 2:
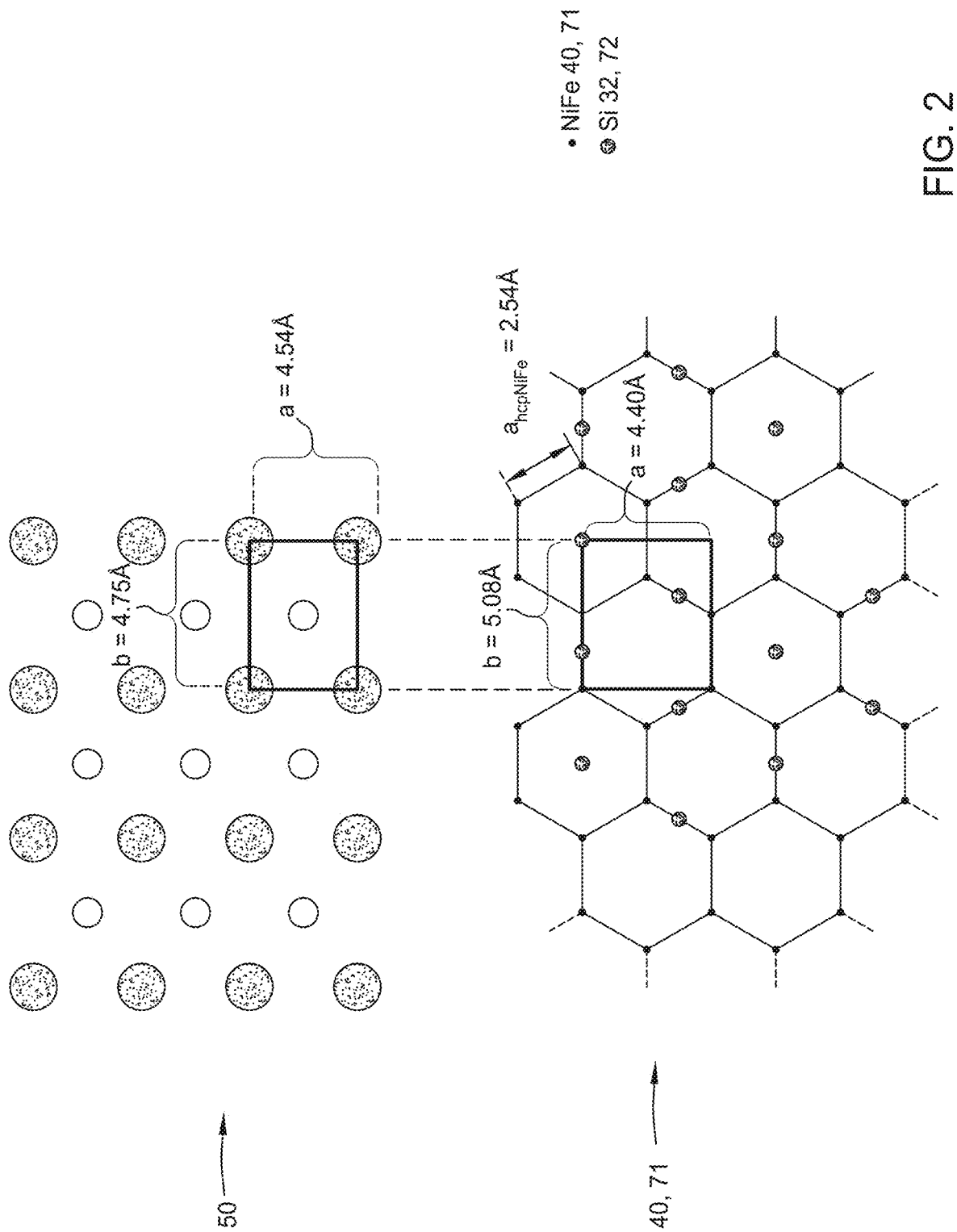
FIG. 2 is a schematic plan view illustrating certain embodiments of a BiSb layer with (012) orientation interfacing with a seed layer or an interlayer.

FIG. 2 is a schematic plan view illustrating certain embodiments of a BiSb layer 50 with (012) orientation formed over a seed layer 30 of FIGS. 1A-1E or of an interlayer 70 formed over a BiSb layer 50 of FIGS. 1B-1E. The seed layer 30 comprises a surface control layer 40 with (111) fcc orientation or with (002) hcp orientation. The interlayer 70 comprises a surface control layer 71 with (111) fcc orientation or with (002) hcp orientation. The different symbols of each layer represent atoms at different depths.

In certain embodiments, a BiSb layer 50 with (012) orientation forms over a surface control layer 40 of the seed layer 30 with (111) fcc orientation or with (002) hcp orientation due to an a-axis lattice parameter of the surface control layer 40 that is in about 2:3 ratio with the a-axis of a silicide layer 32 of the seed layer 30. A surface control layer 40 comprising $Ni_xFe_{1-x}$ (111) with x of about 0.5 has an a-axis lattice parameter which is in about 2:3 ratio with the a-axis of a silicide layer 32. The NiFe (111) surface can line up with the silicide layer 32. The NiFe film has an $a_{hcp}$ parameter of about 2.54 Å. The silicide layer 32 of the seed layer 30 can be crystalline, nano-crystalline, or amorphous depending on the underlying layer upon the growth of the silicide layer 32. The crystalline silicide layer 32 has hexagonal symmetry while nano-crystalline silicide layer 32 has local hexagonal symmetry. Amorphous silicides, such as NiFeSi, with lattice parameters outside the range would not directly promote BiSb (012) texture, but when used with a (111) fcc or (002) hcp textured surface control layer which is in the range, then the silicide can promote strong BiSb (012) texture. For example, a crystalline nickel disilicide ($NiSi_2$) has an $a_{hcp}$ parameter of about 3.830 Å and cobalt silicide ($CoSi_2$) has an $a_{hcp}$ parameter of about 3.793 Å. The dimension of a-$NiFe_{hcp}$ to a-$silicide_{hcp}$ is about 2:3. Structural overlay can be seen in FIG. 2.

The rectangular outline drawn in FIG. 2 of a NiFe (111) surface with parameters of a=about 4.40 Å and b=about 5.08 Å shows that NiFe (111) surface lines up with the approximate rectangular BiSb (012) surface with parameters of a=about 4.54 Å and of b=about 4.75 Å with about 3% mismatch in one direction. Therefore, a (111) textured NiFe thin film can be used as part of a seed layer 30 to grow (012) textured BiSb layer 50. For ease of illustration, FIG. 2 leaves out the NiFe atoms that are at the center of each of the hexagons. However, these NiFe atoms are present at the center of each of the hexagon along with the NiFe atoms at the hexagonal vertices in order to form the (111) surface of NiFe.

In certain embodiments, a BiSb layer 50 with (012) orientation forms over a surface control layer 71 of the interlayer 70 with (111) fcc orientation or with (002) hcp orientation due to an a-axis lattice parameter of the surface control layer 71 that is in about 2:3 ratio with the a-axis of a crystalline disilicide layer 72 of the interlayer 70. A surface control layer 71 comprising $Ni_xFe_{1-x}$ (111) with x of about 0.5 has an a-axis lattice parameter which is in about 2:3 ratio with the a-axis of a silicide layer 72. The NiFe (111) surface can line up with the silicide layer 72. The NiFe film has an $a_{hcp}$ parameter of about 2.54 Å. The silicide layer 72 of the interlayer 70 can be crystalline, nano-crystalline or amorphous. A nano-crystalline silicide layer 72 has local hexagonal symmetry. Amorphous silicides, like NiFeSi, with lattice parameters outside the range would not directly promote BiSb (012) texture, but when used with a (111) fcc or (002) hcp textured surface control layer that is in the range, then the silicide promotes strong BiSb (012) texture. For example, a crystalline nickel disilicide ($NiSi_2$) has an $a_{hcp}$ parameter of about 3.830 Å and cobalt silicide ($CoSi_2$) has an $a_{hcp}$ parameter of about 3.793 Å. The dimension of a-$NiFe_{hcp}$ to a-$silicide_{hcp}$ is about 2:3.

The rectangular outline drawn in FIG. 2 of a NiFe (111) surface with dimensions a=about 4.40 Å and b=about 5.08 Å shows that NiFe (111) surface lines up with the approximate rectangular BiSb (012) surface with dimensions of a=about 4.54 Å and of b=about 4.75 Å with about 3% mismatch in one direction. Therefore, a (111) textured NiFe thin film can be used as part of an interlayer 70 to maintain or enhance (012) textured BiSb layer 50.

The surface control layer 40 of the seed layer 30 or the surface control layer 71 of the interlayer 70 is smooth with reduced interfacial roughness to enhance the BiSb layer 50 with (012) texture.

In certain embodiments, the fcc material with a (111) orientation as shown in FIG. 2, an hcp material with a (002) orientation, or combinations thereof can approximately line up with a BiSb layer 50 with (012) orientation. The (111) orientation of the fcc material or the (002) orientation of the hcp material promotes BiSb growth with (012) orientation instead of BiSb growth with (001) orientation. A BiSb layer 50 with (012) orientation has a higher spin Hall angle and higher performance in a SOT MTJ device than a BiSb layer with a (001) orientation. The SOT MTJ device can be in a perpendicular stack configuration or an in-plane stack configuration. The SOT MTJ device can be utilized in, for example, EAMR writing heads, in MRAM, in artificial intelligence chips, and in other applications.

Figure 3:
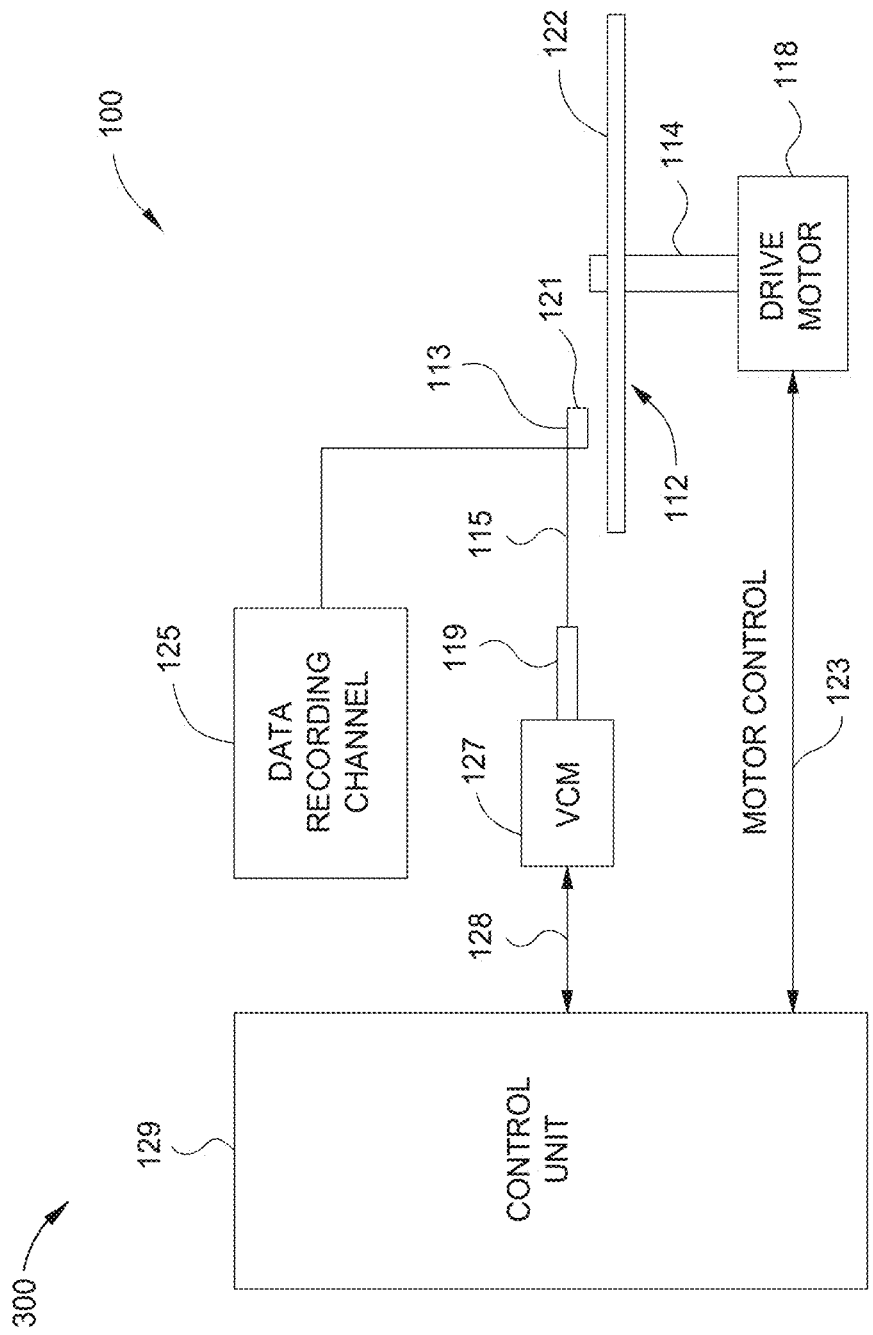
FIG. 3 is a schematic illustration of certain embodiments of a magnetic media drive including an EAMR write head.

FIG. 3 is a schematic illustration of certain embodiments of a magnetic media drive including an EAMR write head having a SOT MTJ device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

At least one slider 113 is positioned near the magnetic disk 112, each slider 113 supporting one or more magnetic head assemblies 121 that include a SOT MTJ device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 3 may be a voice coil motor (VCM). The VCM includes a coil movable within a fixed magnetic field, the direction and speed of the coil movements being controlled by the motor current signals supplied by the control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by the control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to move and position slider 113 to the desired data track on disk 112. Write and read signals are communicated to and from write and read heads on the assembly 121 by way of recording channel 125.

The above description of a typical magnetic media drive and the accompanying illustration of FIG. 3 are for representation purposes only. It should be apparent that magnetic media drives may contain a large number of media or disks, and actuators, and each actuator may support a number of sliders.

Figure 4:
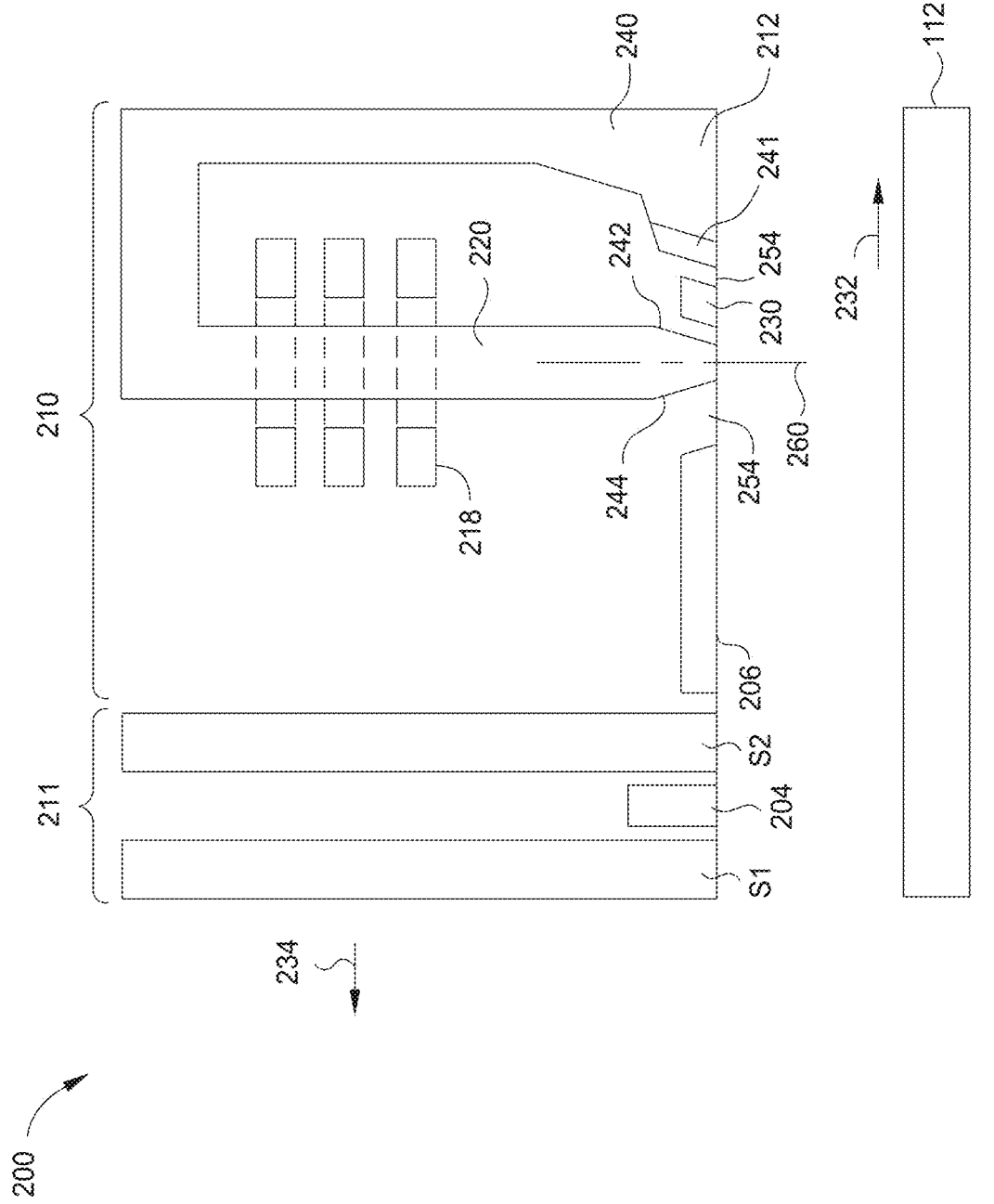
FIG. 4 is a fragmented, cross-sectional side view of a read/write head facing a magnetic medium according to certain embodiments.

FIG. 4 is a fragmented, cross-sectional side view of certain embodiments of a read/write head 200 having a SOT MTJ device. The read/write head 200 faces a magnetic media 112. The read/write head 200 may correspond to the magnetic head assembly 121 described in FIG. 3. The read/write head 200 includes a media facing surface (MFS) 212, such as a gas bearing surface, facing the disk 112, an EAMR write head 210, and a magnetic read head 211. As shown in FIG. 4, the magnetic media 112 moves past the EAMR write head 210 in the direction indicated by the arrow 232 and the read/write head 200 moves in the direction indicated by the arrow 234.

In some embodiments, the magnetic read head 211 is a magnetoresistive (MR) read head that includes an MR sensing element 204 located between MR shields S1 and S2. In other embodiments, the magnetic read head 211 is a magnetic tunnel junction (MTJ) read head that includes an MTJ sensing device 204 located between MR shields S1 and S2. The magnetic fields of the adjacent magnetized regions in the magnetic disk 112 are detectable by the MR (or MTJ) sensing element 204 as the recorded bits.

The EAMR write head 210 includes a main pole 220, a leading shield 206, a trailing shield 240, a spin-orbital torque (SOT) device 230, and a coil 218 that excites the main pole 220. The coil 218 may have a "pancake" structure which winds around a back-contact between the main pole 220 and the trailing shield 240, instead of a "helical" structure shown in FIG. 4. The SOT MTJ device 230 is formed in a gap 254 between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeMN, where M includes at least one of Rh, Al, Ta, Zr, and Ti. In certain embodiments, the trailing shield 240 does not include a trailing shield hot seed layer.

Figure 5:
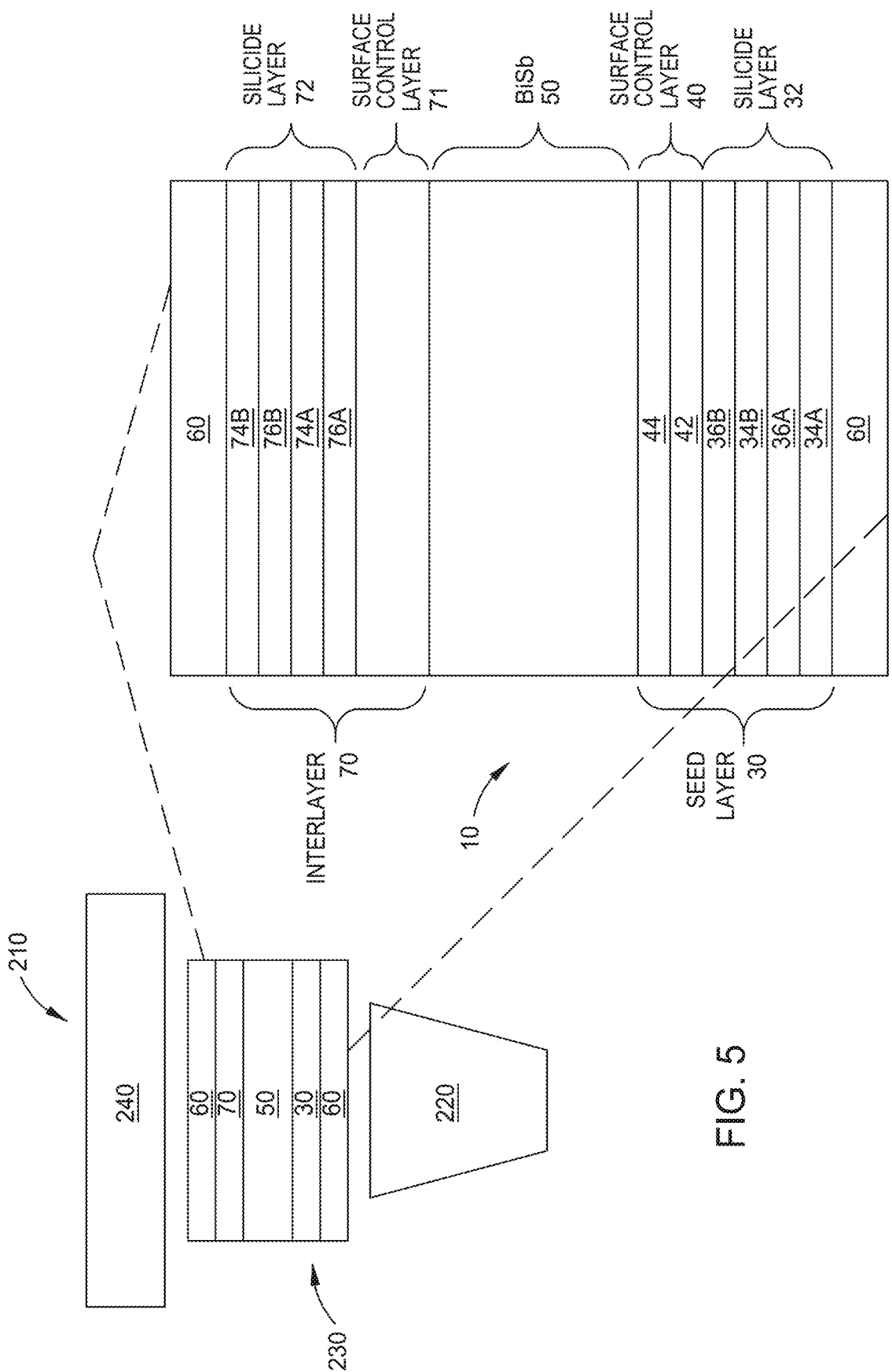
FIG. 5 is a schematic MFS view of certain embodiments of a portion of an EAMR write head.

FIG. 5 is a schematic MFS view of certain embodiments of a portion of a EAMR write head 210 with a SOT MTJ device 230 of FIG. 4 comprising the SOT MTJ device 10 of FIG. 1C or other suitable EAMR write heads. The EAMR write head 210 includes a main pole 220 and a trailing shield 240 in a track direction. The SOT MTJ device 230 is disposed in a gap between the main pole and the trailing shield 240. The EAMR write head 210 comprises double STL layers 60 as shown or a single STL layer.

During operation, charge current through a BiSb layer 50 acting as a spin Hall layer generates a spin current in the BiSb layer. The spin orbital coupling of the BiSb layer and the STLs 60 causes switching or precession of magnetization of the STLs 60 by the spin orbital coupling of the spin current from the BiSb layer 50. Switching or precession of the magnetization of the STLs 60 can generate an assisting field to the write field. Energy assisted write heads based on SOT have multiple times greater power efficiency in comparison to MAMR write heads based on spin transfer torque.

Figure 15:
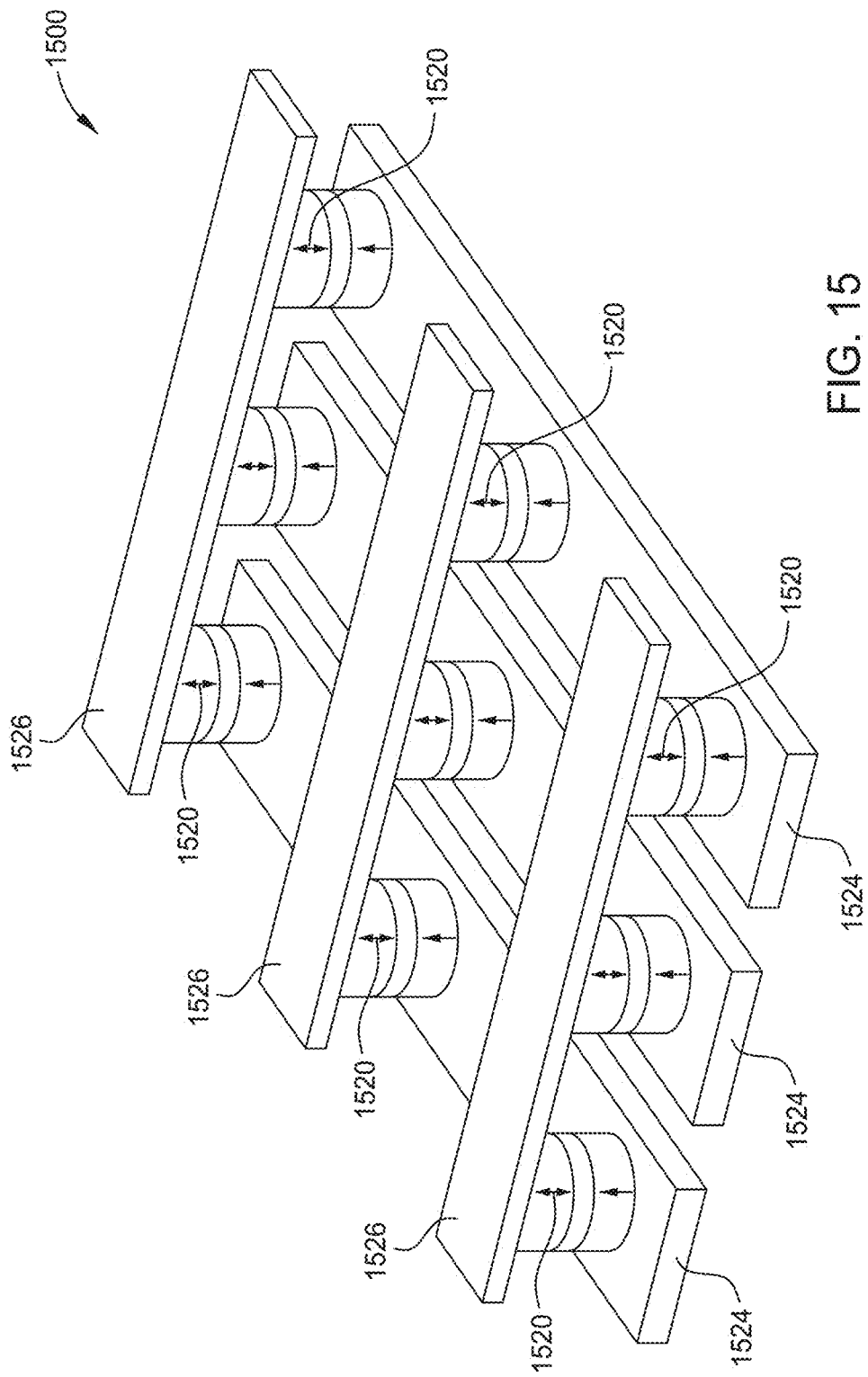
FIG. 15 is a schematic view of certain embodiments of a memory cell array in a cross-point configuration.

FIG. 15 is a schematic view of certain embodiments of a memory cell array 1500 in a cross-point configuration. The memory cell array 1500 is comprised of a plurality of memory cells 1520 forming SOT-based MRAM devices. As shown in FIG. 15, each memory cell 1520 of the memory cell array 1500 comprises the bottom pinned SOT MTJ device 10 of FIG. 1E. In other embodiments (not shown), the memory cells 1520 of the memory cell array 1500 can be topped pinned SOT MTJ device 10 of FIG. 1D. Each of the memory cells 1520 may be in a state representing either a 1 or a 0 bit value. The memory cell array 1500 comprises a plurality of bottom electrodes 1524 and a plurality of spin orbit material electrodes 1526. The spin orbit material electrodes 1526 comprise a BiSb layer with (012) orientation. Each memory cell 1520 may be part of a two-terminal device or a three terminal device. For example, in two-terminal devices, the bottom electrodes 1524 may serve as bit lines, and the spin orbit material electrodes 1526 may serve as word lines. For example, in three-terminal devices, the bottom electrode 1524 can serve as bit lines and read word lines and the spin orbit material electrodes 1526 may service as write word lines. The cross-point array implementation as shown is just an example MRAM implementation, and the various SOT MTJ device embodiments disclosed herein can be implemented in other types of MRAM devices. Other architectures of the memory cell array 1500 are possible including various types and combinations of terminals, gates, transistors, and lines.

Certain embodiments of the present disclosure generally relate to a seed layer and/or an interlayer that promotes the growth of or maintains a bismuth antimony (BiSb) layer with (012) orientation. In certain aspects, a seed layer and/or the interlayer provides a smooth interface with a BiSb layer having (012) texture. In certain aspects, the seed layer and/or the interlayer acts as a barrier against Sb migration from the BiSb layer during processing, such as upon thermal annealing. The seed layer and/or the interlayer promote the growth of and/or maintains the BiSb layer with (012) orientation. A BiSb layer with (012) orientation has a large spin Hall angle effect and high electrical conductivity, such as a resistance of about 1000 uohm-cm or less. A BiSb layer having (012) orientation can be used to form a spin-orbit torque (SOT) magnetic tunnel junction (MTJ) device. For example, a BiSb layer having (012) orientation can be used as a spin Hall layer in a spin-orbit torque device in an energy-assisted magnetic recording (EAMR) write head. In another example, a BiSb layer having (012) orientation can be used as a spin Hall electrode layer in a magnetoresistive random access memory (MRAM) device.

In one embodiment, a spin-orbit torque (SOT) magnetic tunnel junction (MTJ) device includes a substrate, a seed layer over the substrate, and a bismuth antimony (BiSb) layer having (0120) orientation on the seed layer. The seed layer includes a silicide layer and a surface control layer. The silicide layer includes a material of NiSi, NiFeSi, NiFeTaSi, NiCuSi, CoSi, CoFeSi, CoFeTaSi, CoCuSi, or combinations thereof. The surface control layer includes a material of NiFe, NiFeTa, NiTa, NiW, NiFeW, NiCu, NiCuM, NiFeCu, CoTa, CoFeTa, NiCoTa, Co, CoM, CoNiM, CoNi, NiSi, CoSi, NiCoSi, Cu, CuAgM, CuM, or combinations thereof, in which M is Fe, Cu, Co, Ta, Ag, Ni, Mn, Cr, V, Ti, or Si.

In another embodiment, a SOT MTJ device includes a substrate and a BiSb layer with (012) orientation over a substrate. An interlayer is over the BiSb layer. The interlayer includes a silicide layer. The silicide layer includes a material of NiSi, FeSi, CoSi, NiCuSi, NiFeTaSi, CoCuSi, or combinations thereof.

In still another embodiment, a SOT MTJ device includes a substrate, a seed layer over a substrate, and a BiSb layer with (012) orientation on the amorphous film. The seed layer includes an amorphous film comprising a material with a nearest neighbor peak d-spacing matching a (111) d-spacing of an fcc lattice with an a-axis in the range of 3.54 Å to 3.78 Å or a (002) d-spacing of an hcp lattice with a-axis in the range of 2.52 Å to 2.68 Å.

EXAMPLES

The following are examples to illustrate various embodiments of a BiSb layer, such as the BiSb layer 50 of FIGS. 1A-1E, the magnetic drive 100 of FIG. 3, the write head 210 of FIG. 3, the SOT MTJ devices 230 of FIGS. 4 and 5, other BiSb layers, other magnetic drives, other SOT MTJ devices, and variations thereof. These examples are not meant to limit the scope of the claims unless specifically recited in the claims.

Example A

Figure 6:
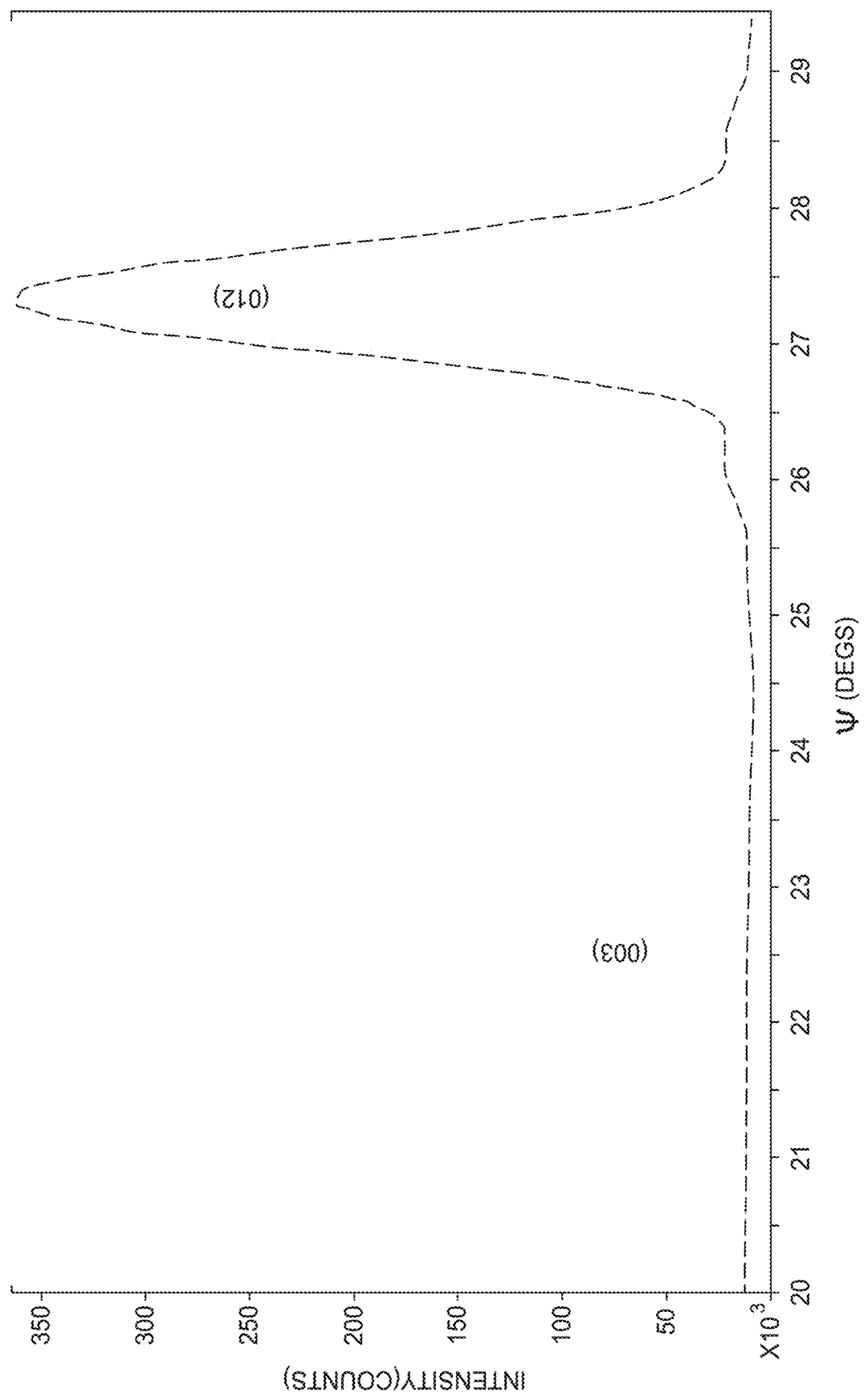
FIGS. 6-8 illustrate X-ray diffraction (XRD) 2Θ scans of samples comprising a BiSb layer with (012) orientation.

In Example A, a sample was formed by physical vapor deposition (PVD) of a base layer of non-conductive amorphous silicon to a thickness of about 18 Å. A single composition graded silicide layer was formed by PVD on the base layer of a laminate Si/NiFe stack with the approximate thicknesses of Si 4 Å, NiFe 2 Å, Si 4 Å, NiFe 2 Å, Si 4 Å, and NiFe 5 Å. A surface control layer of Cu was formed by PVD on the NiFe 5 Å layer to a thickness of about 5 Å silicide layer deposited by PVD. The surface control layer was made of Cu 5 Å. A BiSb layer was formed by PVD on the Cu layer to a thickness of about 100 Å. X-ray diffraction (XRD) 2Θ scans of the sample was conducted as shown in FIG. 6. The BiSb layer showed (012) orientation with a low or no amount of (003) orientation.

Example B

In Example B, sample 710 was formed by PVD of a laminate stack with the approximate thicknesses of Si 14 Å and a NiFe 7 Å. The laminate stack formed a high-resistance, single-composition, graded, silicide layer after room temperature intermixing. A surface control layer of Cu was formed by PVD on the silicide layer to a thickness of about 5 Å. A BiSb layer was formed by PVD on the surface control layer to a thickness of about 100 Å. An interlayer of a laminate stack with the approximate thicknesses of Si 10 Å, NiFe 5 Å, Si 10 Å, and NiFe 5 Å was formed by PVD on the BiSb layer. The interlayer laminate stack formed a high-resistance, single-composition, graded, silicide layer after room temperature intermixing.

Sample 720 was formed by PVD of a seed layer of a laminate stack with the approximate thickness of Si 16 Å and a NiFe 7 Å. The seed layer laminate stack formed a high-resistance, single-composition, graded, silicide layer after room temperature intermixing. A surface control layer of Cu was formed by PVD on the silicide layer to a thickness of about 5 Å. A BiSb layer was formed by PVD on the surface control layer to a thickness of about 100 Å. An interlayer of a laminate stack with the approximate thicknesses of Si 14 Å and NiFe 7 Å was formed by PVD on the BiSb layer. The interlayer laminate stack formed a high-resistance, single-composition, graded, silicide layer after room temperature intermixing.

Sample 730 was formed by PVD of a laminate stack with the approximate thickness of NiFe 5 Å, Si 20 Å, and NiFe 5 Å. The laminate stack formed a high-resistance, single-composition, graded, silicide layer after room temperature intermixing. A surface control layer of Cu was formed by PVD on the silicide layer to a thickness of about 5 Å. A BiSb layer was formed by PVD on the surface control layer to a thickness of about 100 Å. An interlayer of a laminate stack with the approximate thicknesses of Si 12 Å and NiFe 6 Å was formed by PVD on the BiSb layer. The interlayer laminate stack formed a high-resistance, single-composition, graded, silicide layer after room temperature intermixing.

Sample 740 was formed by PVD of a laminate stack with the approximate thickness of NiFe 10 Å, Si 25 Å, and NiFe 5 Å. The laminate stack formed a high-resistance, single-composition, graded, silicide layer after room temperature intermixing. A surface control layer of Cu was formed by PVD on the silicide layer to a thickness of about 5 Å. A BiSb layer was formed by PVD on the surface control layer to a thickness of about 100 Å. An interlayer of a laminate stack with the approximate thicknesses of Si 12 Å and NiFe 6 Å was formed by PVD on the BiSb layer. The interlayer laminate stack formed a high-resistance, single-composition, graded, silicide layer after room temperature intermixing.

Sample 750 was formed by PVD of a base layer of non-conductive amorphous Si deposited to a thickness of about 18 Å. A laminate stack was formed by PVD on the base layer with the approximate thicknesses of Si 4 Å, NiFe 2 Å, Si 4 Å, NiFe 2 Å, Si 4 Å, and NiFe 2 Å. The laminate stack formed a high-resistance, single-composition, graded, silicide layer after room temperature intermixing. A surface control layer with the approximate thicknesses of NiFe 3 Å and Cu 5 Å was formed by PVD on the silicide layer. The surface control layer remained metallic. A BiSb layer was formed by PVD on the surface control layer to a thickness of about 100 Å. An interlayer of a laminate stack with the approximate thicknesses of Si 12 Å and NiFe 6 Å was formed by PVD on the BiSb layer. The interlayer laminate stack formed a high-resistance, single-composition, graded, silicide layer after room temperature intermixing. A capping layer of NiFe was formed by PVD on the interlayer to a thickness of about 30 Å. The capping layer remained metallic.

Sample 760 was formed by PVD of a laminate stack with the approximate thickness of Si 20 Å and NiFe 7 Å. The laminate stack formed a high-resistance, single-composition, graded, silicide layer after room temperature intermixing. A surface control layer of Cu was formed by PVD on the silicide layer to a thickness of about 5 Å. A BiSb layer was formed by PVD on the surface control layer to a thickness of about 100 Å. An interlayer of a laminate stack with the approximate thicknesses of Si 8 Å, NiFe 4 Å, Si 8 Å, and NiFe 4 Å was formed by PVD on the BiSb layer. The interlayer laminate stack formed a high-resistance, single-composition, graded, silicide layer after room temperature intermixing.

Figure 7:
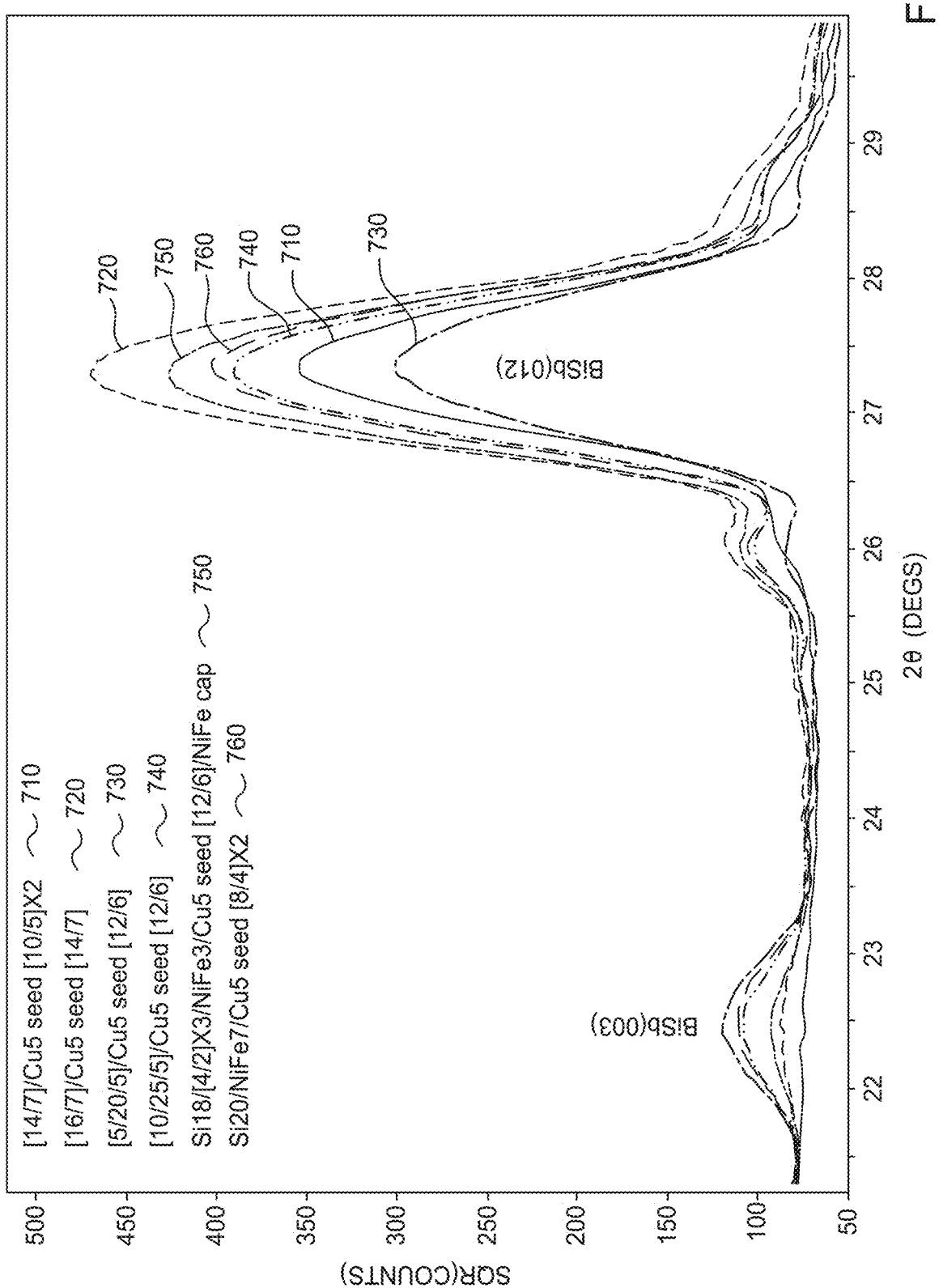
Figure 8:
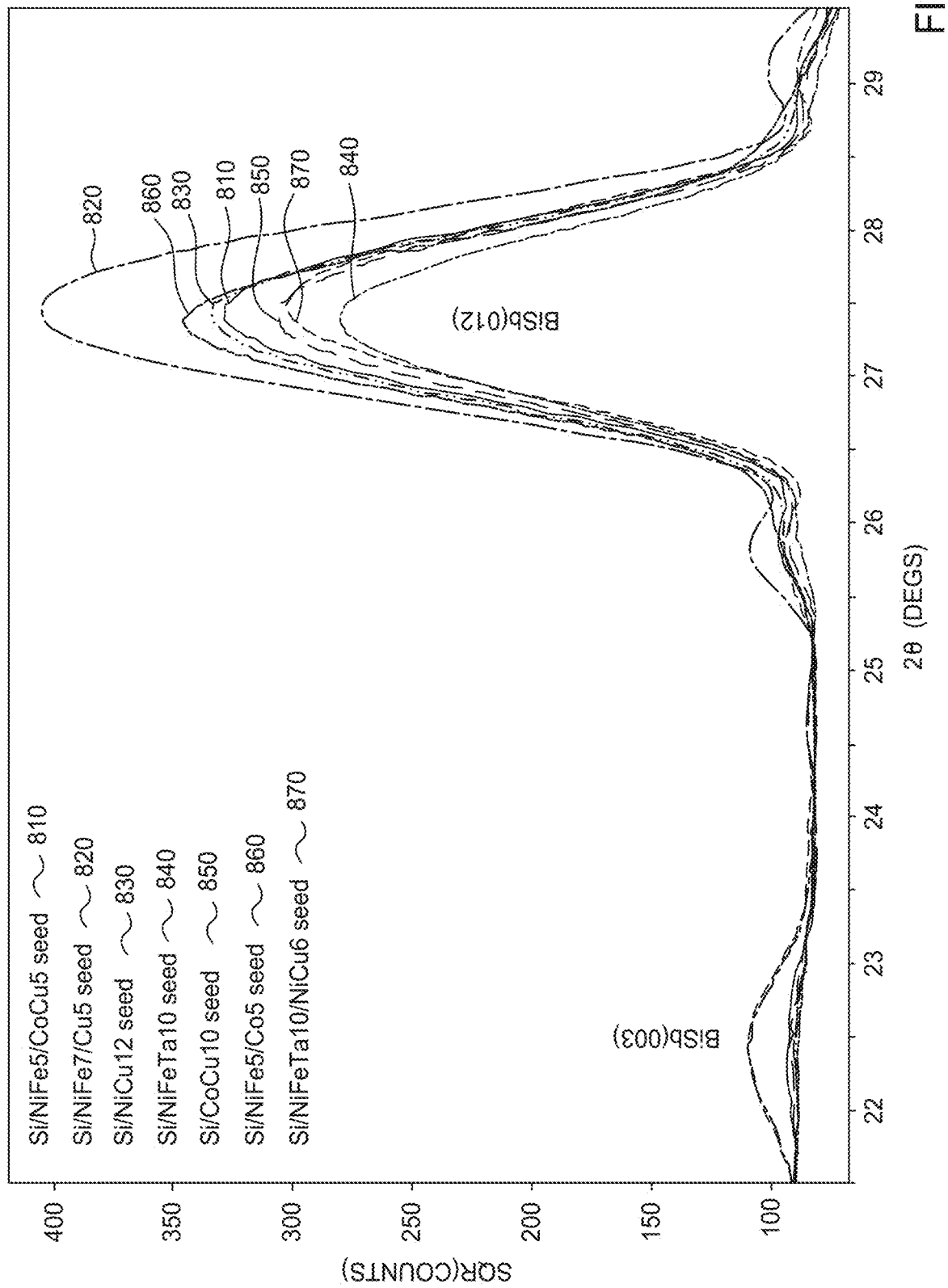

X-ray diffraction (XRD) 2Θ scans of the samples 710, 720, 730, 740, 750, 760 were conducted as shown in FIG. 7. The samples showed (012) orientation of the BiSb layer with a low or no amount of (003) orientation as provided by a seed layer of the silicide layer and a surface control layer and the interlayer.

Example C

In Example C, sample 810 was formed by PVD of a NiFe layer to a thickness of about 5 Å on a silicon wafer. The NiFe layer formed a high-resistance, silicide layer with the silicon wafer after room temperature intermixing. A surface control layer of CoCu was formed by PVD on the silicide layer to a thickness of about 5 Å. A BiSb layer was formed by PVD on the surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 820 was formed by PVD of a NiFe layer to a thickness of about 7 Å on a silicon wafer. The NiFe layer formed a high-resistance, silicide layer with the silicon wafer after room temperature intermixing. A surface control layer of Cu was formed by PVD on the silicide layer to a thickness of about 5 Å. A BiSb layer was formed by PVD on the surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 830 was formed by PVD of a NiCu layer to a thickness of about 12 Å on a silicon wafer. The bottom part of NiCu layer formed a high-resistance, silicide layer with the silicon wafer after room temperature intermixing. A BiSb layer was formed by PVD on the top part of the NiCu layer acting as a surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 840 was formed by PVD of a NiFeTa layer to a thickness of about 10 Å on a silicon wafer. The bottom part of NiFeTa layer formed a high-resistance, silicide layer with the silicon wafer after room temperature intermixing. A BiSb layer was formed by PVD on the top part of the NiFeTa layer acting as a surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 850 was formed by PVD of a CoCu layer to a thickness of about 10 Å on a silicon wafer. The bottom part of CoCu a layer formed a high-resistance, silicide layer with the silicon wafer after room temperature intermixing. A BiSb layer was formed by PVD on the top part of the CoCu layer acting as a surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 860 was formed by PVD of a NiFe layer to a thickness of about 5 Å on a silicon wafer. The NiFe layer formed a high-resistance, silicide layer with the silicon wafer after room temperature intermixing. A surface control layer of Co was formed by PVD on the silicide layer to a thickness of about 5 Å. A BiSb layer was formed by PVD on the surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

Sample 870 was formed by PVD of a NiFeTa layer to a thickness of about 10 Å on a silicon wafer. The bottom part of the NiFeTa layer formed a high-resistance, silicide layer with the silicon wafer after room temperature intermixing. A surface control layer of NiCu was formed by PVD on the top part of the NiFeTa layer to a thickness of about 6 Å. A BiSb layer was formed by PVD on the surface control layer to a thickness of about 100 Å. A surface control layer of Co was formed by PVD on the BiSb layer to a thickness of about 10 Å. A metal layer was formed by on the surface control layer to approximate thicknesses of NiFeTa 12 Å and Pt 12 Å. The surface control layer of Co help provide Pt(111) texture through the amorphous NiFeTa layer for growth of a perpendicular magnetic layer thereover.

X-ray diffraction (XRD) 2Θ scans of the samples 810, 820, 830, 840, 850, 860, 870 were conducted as shown in FIG. 7. The samples showed (012) orientation of the BiSb layer with a low or no amount of (003) orientation as provided by a seed layer of the silicide layer and a surface control layer and the interlayer. The top surface of the silicon wafer of each of the samples formed a non-conduct, single-composition, grade silicide layer intermixing at room temperature with all or part of the metal layer formed on the wafer. The silicide layer is stable, amorphous, smooth, high resistive for growth a BiSb layer thereof. In samples 830 and 850, Cu from the Cu alloy metal layers formed on the silicon wafer tends to be pushed out of the silicide layer forming a Cu layer acting as a surface control layer for growth of BiSb layer thereon, while some Cu remains in the silicide. A surface control layer on the BiSb layer reduces BiSb surface roughness and promotes texture to magnetic layers formed thereover.

Example D

Figure 9:
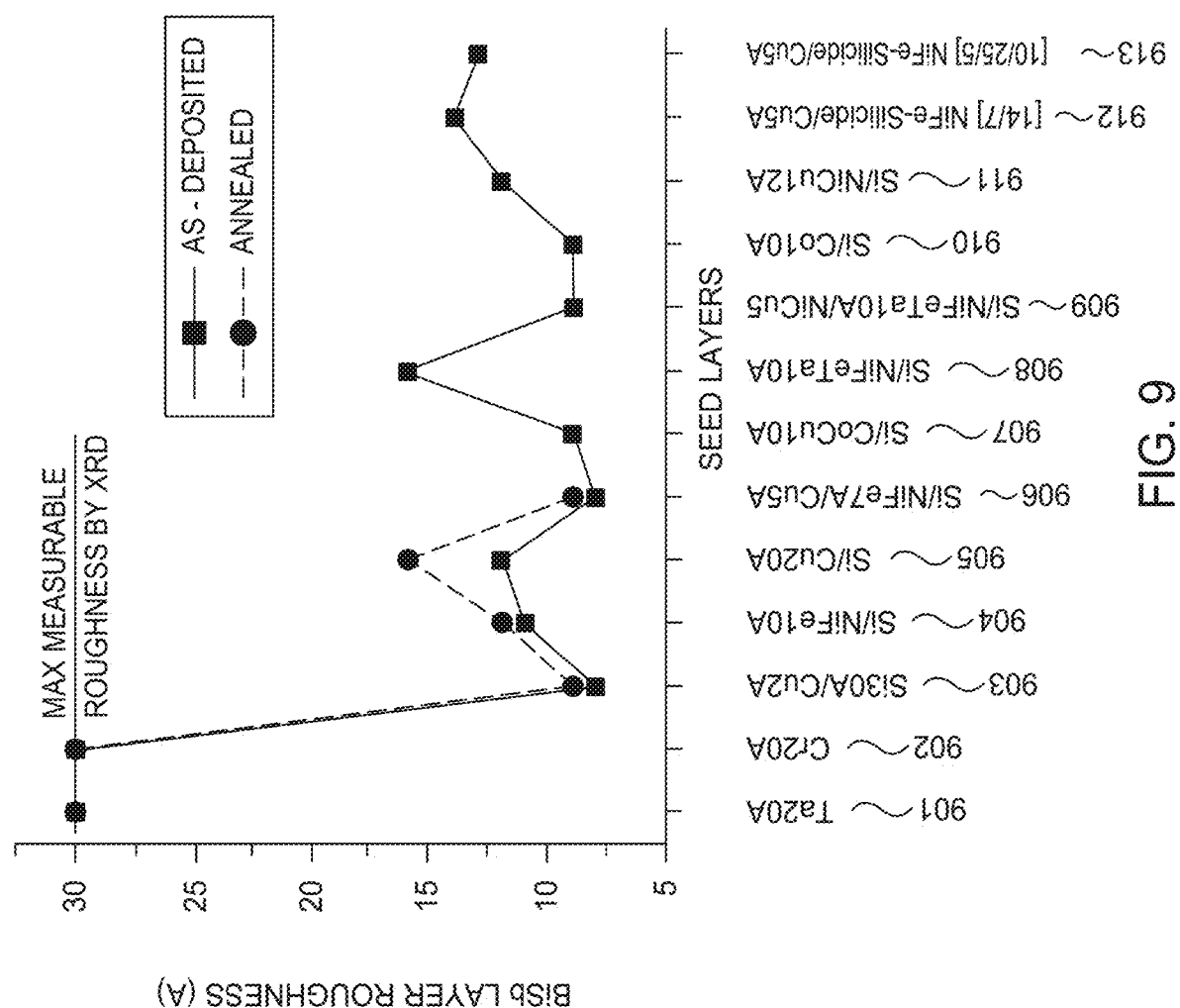
FIGS. 9 and 10 illustrate surface roughness measurements of a BiSb layer over a seed layer of various materials.

In Example D, samples were formed by PVD deposition of a seed layer over a substrate and then by PVD deposition of a BiSb layer to a thickness of about 100 Å over the seed layer. A capping layer was deposited on the BiSb layer. The BiSb interfacial surface roughness was measured by XRR. Some of the samples were further annealed at a temperature of about 210° C. and the BiSb interfacial surface roughness was re-measured. The measured surface roughness is plotted in FIG. 9.

Sample 901 included a seed layer of Ta deposited to a thickness of about 20 Å on a silicon wafer. A laminated silicide capping layer of a 10 Å of silicon, 5 Å of NiFe, 10 Å of Si, and 5 Å of Fe was deposited on the BiSb layer to an approximate effective total thickness of 20 Å of NiFe-silicide. Sample 902 included a seed layer of Cr deposited to a thickness of about 20 Å on a silicon wafer. A laminated silicide capping layer of a 10 Å of silicon, 5 Å of NiFe, 10 Å of Si, and 5 Å of Fe was deposited on the BiSb layer to an approximate effective total thickness of 20 Å of NiFe-silicide. Sample 903 included a seed layer of Si deposited to a thickness of about 30 Å and then Cu deposited to a thickness of about 2 Å. A laminated silicide capping layer of a 10 Å of silicon, 5 Å of NiFe, 10 Å of Si, and 5 Å of Fe was deposited on the BiSb layer to an approximate effective total thickness of 20 Å of NiFe-silicide. Sample 904 included a seed layer of NiFe deposited to a thickness of about 10 Å on a silicon wafer. A capping layer of a 10 Å of cobalt, 12 Å of NiFeTa, and 12 Å of Pt was deposited on the BiSb layer. Sample 905 included a seed layer of Cu deposited to a thickness of about 20 Å on a silicon wafer. A capping layer of a 10 Å of cobalt, 12 Å of NiFeTa, and 12 Å of Pt was deposited on the BiSb layer. Sample 906 included a seed layer of NiFe deposited to a thickness of about 7 Å on a silicon wafer and then Cu deposited to a thickness of about 5 Å. A capping layer of a 10 Å of cobalt, 12 Å of NiFeTa, and 12 Å of Pt was deposited on the BiSb layer. Sample 907 included a seed layer of CoCu deposited to a thickness of about 10 Å on a silicon wafer. A capping layer of a 10 Å of cobalt, 12 Å of NiFeTa, and 12 Å of Pt was deposited on the BiSb layer. Sample 908 included a seed layer of NiFeTa deposited to a thickness of about 10 Å on a silicon wafer. A capping layer of a 10 Å of cobalt, 12 Å of NiFeTa, and 12 Å of Pt was deposited on the BiSb layer. Sample 909 included a seed layer of NiFeTa deposited to a thickness of about 10 Å on a silicon wafer, and then NiCu deposited to a thickness of about 5 Å. A capping layer of a 10 Å of cobalt, 12 Å of NiFeTa, and 12 Å of Pt was deposited on the BiSb layer. Sample 910 included a seed layer of Co deposited to a thickness of about 10 Å on a silicon wafer. A capping layer of a 10 Å of cobalt, 12 Å of NiFeTa, and 12 Å of Pt was deposited on the BiSb layer. Sample 911 included a seed layer of NiCu deposited to a thickness of about 12 Å on a silicon wafer. A capping layer of a 10 Å of cobalt, 12 Å of NiFeTa, and 12 Å of Pt was deposited on the BiSb layer. Sample 912 included a seed layer of Si deposited to a thickness of about 14 Å, then NiFe deposited to a thickness of about 7 Å, and then Cu deposited to a thickness of about 5 Å. A laminated silicide capping layer of a 10 Å of silicon, 5 Å of NiFe, 10 Å of Si, and 5 Å of Fe was deposited on the BiSb layer to an approximate effective total thickness of 20 Å of NiFe-silicide. Sample 913 included a seed layer of NiFe deposited to a thickness of about 10 Å, then Si deposited to a thickness of about 25 Å, then NiFe deposited to a thickness of about 5 Å, and then Cu deposited to a thickness of about 5 Å. A laminated silicide capping layer of a 10 Å of silicon, 5 Å of NiFe, 10 Å of Si, and 5 Å of Fe was deposited on the BiSb layer to an approximate effective total thickness of 20 Å of NiFe-silicide.

Each of the samples formed a silicide layer from the metal intermixing with the underlying silicon wafer and/or form metal intermixing with a deposited silicon layer. Samples 901, 902 with a seed layer of metal showed a high surface roughness of the BiSb layer. Samples 903-913 with a seed layer comprising a silicide layer showed a low surface roughness of the BiSb layer.

Example E

In Example E, samples were formed by PVD deposition a laminate stack with an approximate thickness of Si 30 Å and NiFe 7 Å. The laminate stack formed a high-resistance, silicide layer with at top portion or entire portion of the Si layer silicon wafer after room temperature intermixing. A surface control layer of Cu was formed by PVD on the silicide layer to a thickness of about 5 Å. A BiSb layer was formed by PVD on the surface control layer to a thickness of about 100 Å.

Sample 1001 includes a Ta layer was formed to a thickness of about 10 Å by PVD on the BiSb layer. Sample 1002 includes a Ta layer was formed to a thickness of about 20 Å by PVD on the BiSb layer. Sample 1003 includes a Cr layer was formed to a thickness of about 20 Å by PVD on the BiSb layer.

Sample 1004 includes an interlayer of Si formed to a thickness of about 30 Å by PVD on the BiSb layer.

Sample 1005 includes an interlayer of a laminate stack with the approximate thicknesses of Cu 10 Å and a-Si 30 Å was formed by PVD on the BiSb layer. Some of the Cu formed a silicide while most of the Cu remained metallic Cu.

Sample 1006 includes an interlayer of a laminate stack with the approximate thicknesses of NiFe 10 Å and Si 30 Å was formed by PVD on the BiSb layer. The interlayer laminate stack formed a high-resistance, single-composition, graded, silicide layer after room temperature intermixing.

Sample 1007 includes an interlayer of a laminate stack with the approximate thicknesses of Si 10 Å and NiFe 5 Å was formed by PVD on the BiSb layer. The interlayer laminate stack formed a high-resistance, single-composition, graded, silicide layer after room temperature intermixing.

Sample 1008 includes an interlayer of a laminate stack with the approximate thicknesses of NiFe 5 Å and Si 10 Å was formed by PVD on the BiSb layer. The interlayer laminate stack formed a high-resistance, single-composition, graded, silicide layer after room temperature intermixing.

Figure 10:
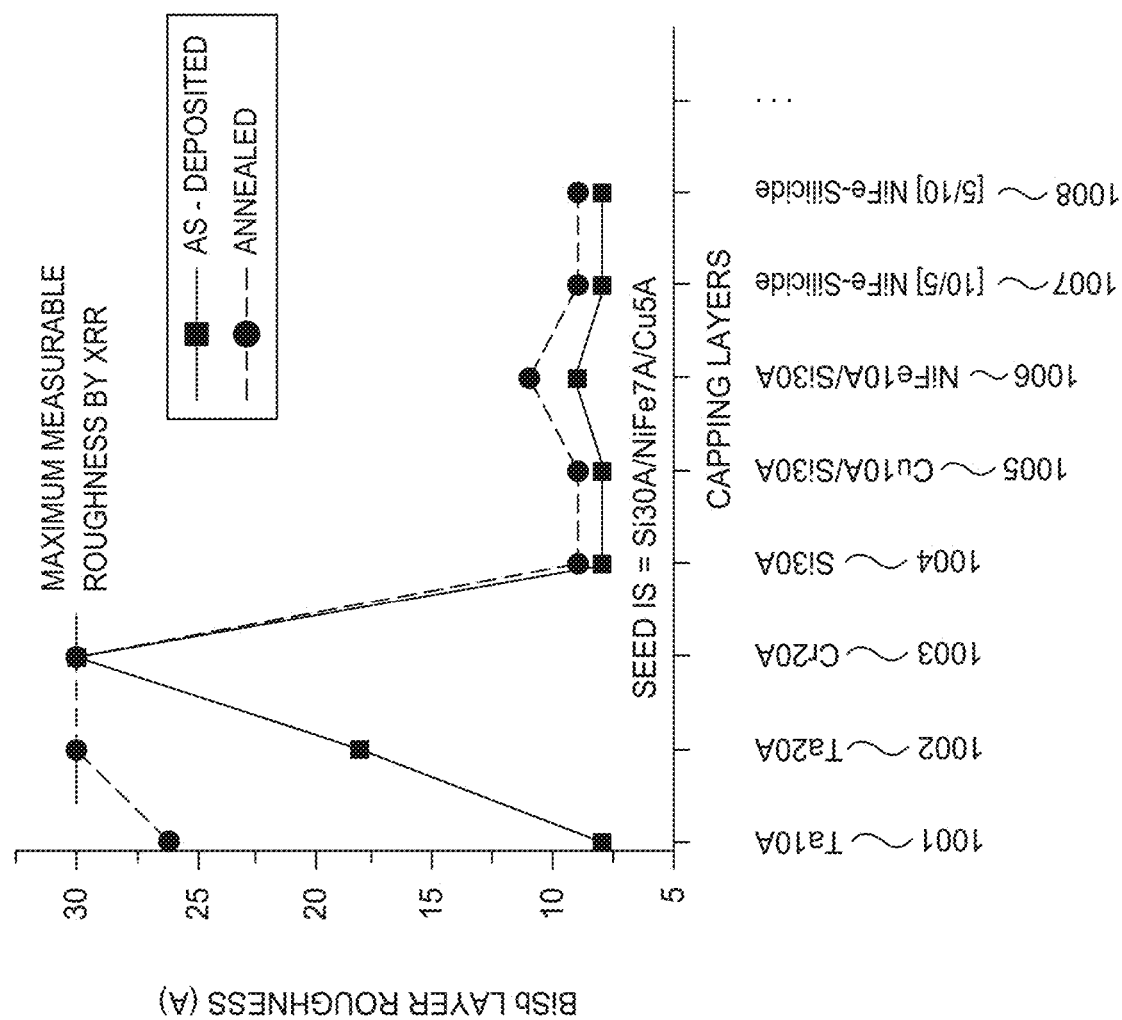

The surface roughness of the samples as deposited was measured. The samples were further annealed at a temperature of about 210° C. and the surface roughness of the samples was re-measured. The surface roughnesses as deposited and after anneal are plotted in FIG. 10. Samples 1001, 1002, 1003 showed high surface roughness after anneal showing that the metal layers on the BiSb layer did not enhance the smoothness of the BiSb layer by allowing Sb migration during anneal. Samples 1004, 1005, 1006, 1007, 1008 showed low surface roughness after anneal showing that the interlayer on the BiSb layer enhanced the smoothness of the BiSb layer by restricting Sb migration during anneal.

Example F

In Example F, sample 1101 was formed by PVD of a seed layer of CoCu on a silicon wafer to a thicknesses of about 12 Å. The bottom portion of the seed layer formed a high-resistance, single-composition, graded, silicide layer after room temperature intermixing with a top portion of the silicon wafer. A BiSb layer was formed by PVD on top portion of the seed layer to a thickness of about 100 Å. An interlayer of Co was formed by PVD on the BiSb layer to a thickness of about 12 Å. A Pt seed layer was deposited over the interlayer, such as for growth of a PMA layer.

Sample 1102 was formed by PVD of a seed layer formed to the approximate thicknesses of NiFe 5 Å and Cu 9 Å. The NiFe of the seed layer formed a high-resistance, single-composition, graded, silicide layer after room temperature intermixing with a top portion of the silicon wafer. A BiSb layer was formed by PVD on the Cu of the seed layer to a thickness of about 100 Å. A NiCu interlayer was formed by PVD on the BiSb layer to the approximate thickness of 10 Å. The NiCu interlayer can also be a laminate of thin Ni and Cu layers. A Pt seed layer was deposited over the interlayer, such as for growth of a PMA layer.

Sample 1104 was formed by PVD of a seed layer formed to the approximate thicknesses of NiFe 7 Å, underneath a NiCu 6 Å control layer. The NiFe of the seed layer formed a high-resistance, single-composition, graded, silicide layer after room temperature intermixing with a top portion of the silicon wafer. A BiSb layer was formed by PVD on the NiCu control layer to a thickness of about 100 Å. An interlayer of Co was formed by PVD on the BiSb layer to a thickness of about 10 Å. A Pt seed layer was deposited over the interlayer, such as for growth of a PMA layer.

Sample 1105 was formed by PVD of an amorphous seed NiFeTa33 layer formed to the approximate thicknesses of NiFeTa 10 Å, underneath a NiCu control layer of 10 Å, The NiCu interlayer can also be a laminate of thin Ni and Cu layers. The NiFeTa33 of the seed layer formed a high-resistance, single-composition, graded, silicide layer after room temperature intermixing with a top portion of the silicon wafer. A BiSb layer was formed by PVD on the NiCu of the control layer to a thickness of about 100 Å. An interlayer of Co was formed by PVD on the BiSb layer to a thickness of about 10 Å. A Pt seed layer was deposited over the interlayer, such as for growth of a PMA layer.

Sample 1106 was formed by PVD of a NiCu seed layer formed to the approximate thicknesses of 12 Å. The NiCu interlayer can also be a laminate of thin Ni and Cu layers. Some of the Ni of the seed layer formed a high-resistance, single-composition, graded, silicide layer after room temperature intermixing with a top portion of the silicon wafer. A BiSb layer was formed by PVD on the NiCu of the control layer to a thickness of about 100 Å. An interlayer of Co was formed by PVD on the BiSb layer to a thickness of about 10 Å. A Pt seed layer was deposited over the interlayer, such as for growth of a PMA layer.

X-ray diffraction (XRD) 2Θ scans of the samples 1101, 1102, 1104, 1105, and 1106 were conducted as shown in FIG. 11. The samples showed (012) orientation of the BiSb layer with a low or no amount of (003) orientation as provided by the seed layer and the interlayer. Each of the samples formed a silicide layer from the seed layer and a top surface of the silicon wafer. Each of these samples included an interlayer than helped improve BiSb roughness (i.e., increase smoothness on anneal. The interlayer can be chosen to enhance texture of the subsequent layers, such as the seed layer for a perpendicular magnetic layer. For example, sample 1102 showed that an interlayer of a Ni/Cu laminate enhances (111) texture for better perpendicular magnetic anisotropy properties, such as growth of Pt (111) used for the PMA seed layer. Sample 1105 showed that use of NiCu as a control layer when used with an amorphous seed layer NiFeTa can also be used to enhance growth of the Pt (111) seed layer texture used for the PMA layer.

Example G

In Example G, samples were formed by depositing an amorphous NiFeTa layer over a substrate by PVD and depositing a BiSb layer over the NiFeTa layer to a thickness of about 100 Å. The NiFeTa layer of sample 1201 contained about 62 atomic % of Ta and was deposited to a thickness of 20 Å. The NiFeTa layer of sample 1202 contained about 33 atomic % of Ta and was deposited to a thickness of 15 Å. The NiFeTa layer of sample 1203 contained about 27 atomic % of Ta and was deposited to a thickness of 15 Å. The NiFeTa layer of sample 1204 contained about 22 atomic % of Ta and was deposited to a thickness of 15 Å.

FIG. 12 shows amorphous NiFeTa seed composition XRD 2Θ scans of BiSb (012) texture where the Ta composition matches expected value based on the measured lattice parameter of the amorphous alloy which matches BiSb (012) approximate rectangular surface (short 'a' side).

Sample 1202 showed a larger amount of BiSb (012) texture than sample 1203. Sample 1203 showed a larger amount of BiSb (012) texture than sample 1204. Sample 1204 showed a larger amount of BiSb (012) texture than sample 1201.

The insert in FIG. 12 is a schematic image of a surface of an amorphous NiFeTa layer. The amorphous NiFeTa layer shows a surface with local hexagonal symmetry with uniform size grain sizes.

Example H

FIG. 13 shows a plot of amorphous peak lattice spacing converted into an fcc a-axis and plotted versus composition of alloying element (NiFe) (1-x) $M_x$ for M=Ta, W, Si. The rectangular box indicates the lattice parameter range for amorphous alloys to have and produce strong (012) BiSb texture, along with composition range for NiFeM amorphous alloys where M=Ta, W, Si. For alloying element (NiFe)(1-x)$M_x$ for M=Ta, W within the rectangle box, the lattice parameter range to match BiSb and produce strong (012) BiSb texture for NiFeTa$_x$ is 22<x<43, such as 32<x<37 and for NiFeW$_x$ is 19<x<40, such as 28<x<40. NiFeSi lattice seems to be below the lattice spacing to directly promote strong BiSb (012) texture. However, NiFeSi is used with a surface control layer such as Cu, CuAgNi, then NiFeSi promotes strong BiSb (012) texture. For example, a NiFe silicide formed to a thickness from about 8 Å to 30 Å with a Cu or CuAgNi layer thereover formed to a thickness from about 2 Å to about 5 Å seed layer promotes strong BiSb (012) texture.

Example I

FIG. 14 shows a plot of amorphous peak lattice spacing converted an hcp (sqrt2 factor) and plotted versus composition of alloying element (NiFe) (1-x) $M_x$ for M=Ta, W, Si. For amorphous silicide with lattice parameter outside the range like NiFeSi would not directly promote BiSb (012) texture, but when used with a (111) fcc or (002) hcp textured surface control layer that is in the range, the silicide promotes strong BiSb (012) texture. For example, a NiFe silicide formed to a thickness from about 8 Å to 30 Å with a Cu or CuAgNi layer thereover formed to a thickness from about 2 Å to about 5 Å seed layer promotes strong BiSb (012) texture.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) magnetic tunnel junction (MTJ) device, comprising:
    a substrate;
    a seed layer over the substrate, the seed layer comprising:
        a silicide layer comprising a material selected from a group consisting of NiSi, NiFeSi, NiFeTaSi, NiCuSi, CoSi, CoFeSi, CoFeTaSi, CoCuSi, and combinations thereof; and
        a surface control layer comprising a material selected from a group consisting of NiFe, NiFeTa, NiTa, NiW, NiFeW, NiCu, NiCuM, NiFeCu, CoTa, CoFeTa, NiCoTa, Co, CoM, CoNiM, CoNi, NiSi, CoSi, NiCoSi, Cu, CuAgM, CuM, and combinations thereof, wherein M is selected from a group consisting of Fe, Cu, Co, Ta, Ag, Ni, Mn, Cr, V, Ti, and Si; and
    a bismuth antimony (BiSb) layer on the seed layer, the BiSb layer having a (012) orientation.

2. The SOT MTJ device of claim 1, wherein the silicide layer has a thickness from about 1 Å to about 30 Å.

3. The SOT MTJ device of claim 1, wherein the silicide layer comprises one or more stacks of a laminate comprising a silicon layer and a metal layer, the metal layer comprising a material selected from a group consisting of Ni, NiFe, NiFeTa, NiCu, Co, CoFe, CoFeTa, CoCu, and combinations thereof.

4. The SOT MTJ device of claim 3, wherein the silicide layer comprises one to four stacks of the laminate.

5. The SOT MTJ device of claim 1, wherein the surface control layer has a thickness from about 1 Å to about 20 Å.

6. The SOT MTJ device of claim 1, wherein the surface control layer comprises a first layer over the silicide layer and comprises a second layer over the first layer,
    wherein the first layer comprises a material selected from a group consisting of NiFe, NiFeTa, NiTa, NiW, NiFeW, NiCu, NiCuAg, NiCuM, NiFeCu, CoTa, CoFeTa, NiCoTa, Co, CoCu, and combinations thereof, in which M is selected from a group consisting of Fe, Cu, Co, Ta, Ag, Ni, Mn, Cr, V, Ti, and Si, and
    wherein the second layer comprises a material selected from a group consisting of CoNi, NiSi, CoSi, NiCoSi, CuAgNi, CuM, CuNiM, Ni, CoCu, Cu, Co, NiCu, and combinations thereof, in which M is selected from a group consisting of Fe, Cu, Co, Ta, Ag, Ni, Mn, Cr, V, Ti, and Si.

7. The SOT MTJ device of claim 1, further comprising a silicon base layer between the substrate and the seed layer, the silicon base layer having a thickness from about 1 Å and about 30 Å.

8. A magnetic media drive, comprising the SOT MTJ device of claim 1.

9. A magnetoresistive random access memory device, comprises the SOT MTJ device of claim 1.

10. A magnetic recording write head, comprising the SOT MTJ device of claim 1.

11. A spin-orbit torque (SOT) magnetic tunnel junction (MTJ) device, comprising:
 a substrate;
 a seed layer disposed over the substrate;
 a bismuth antimony (BiSb) layer over the seed layer, the BiSb layer having a (012) orientation; and
 an interlayer over the BiSb layer, the interlayer comprising:
  a silicide layer comprising a material selected from a group consisting of NiSi, FeSi, CoSi, NiCuSi, NiFeTaSi, CoCuSi, and combinations thereof.

12. The SOT MTJ device of claim 11, wherein the silicide layer has a thickness from about 1 Å to about 30 Å.

13. The SOT MTJ device of claim 11, wherein the silicide layer comprises one or more stacks of a laminate, the laminate comprising a silicon layer and a metal layer, the metal layer comprising a material selected from a group consisting of Ni, Fe, Co, NiCu, NiFeTa, CoCu, NiFe, NiFeCu, Cu, and combinations thereof.

14. The SOT MTJ device of claim 13, wherein the silicide layer comprises one to four stacks of the laminate.

15. The SOT MTJ device of claim 11, wherein the interlayer further comprises a surface control layer between the BiSb layer and the silicide layer, the surface control layer comprising a material selected from a group consisting of Cu, Ni, NiFe, Fe, Co, NiCu, NiFeTa, CoCu, NiFeCu, and combinations thereof.

16. The SOT MTJ device of claim 15, wherein the interlayer has a thickness from about 1 Å to about 10 Å.

17. The SOT MTJ device of claim 11, further comprising a perpendicular magnetic anisotropy (PMA) ferromagnetic layer over the interlayer.

18. A magnetic media drive, comprising the SOT MTJ device of claim 11.

19. A magnetoresistive random access memory device, comprises the SOT MTJ device of claim 11.

20. A magnetic recording write head, comprising the SOT MTJ device of claim 11.

21. A spin-orbit torque (SOT) magnetic tunnel junction (MTJ) device, comprising:
 a substrate;
 a seed layer over the substrate, the seed layer comprising:
  an amorphous film comprising a material with a nearest neighbor peak d-spacing matching a spacing selected from a group consisting of:
   a (111) d-spacing of an fcc lattice with an a-axis in the range of 3.54 Å to 3.78 Å, and
   a (002) d-spacing of an hcp lattice with an a-axis in the range of 2.52 Å to 2.68 Å; and
 a bismuth antimony (BiSb) layer on the amorphous film, the BiSb layer having a (012) orientation.

22. The SOT MTJ device of claim 21, wherein the seed layer further comprises a silicide layer between the substrate and the amorphous film, the silicide layer comprising a material selected from a group consisting of NiSi, NiFeSi, NiFeTaSi, NiCuSi, CoSi, CoFeSi, CoFeTaSi, CoCuSi, and combinations thereof.

23. The SOT MTJ device of claim 21, further comprising an interlayer on the BiSb layer, the interlayer comprising:
 an amorphous film on the BiSb layer, the amorphous film comprising:
  a material with a nearest neighbor peak d-spacing matching a spacing selected from a group consisting of:
   a (111) d-spacing of an fcc lattice with an a-axis in the range of 3.54 Å to 3.78 Å and
   a (002) d-spacing of an hcp lattice with an a-axis in the range of 2.52 Å to 2.68 Å.

24. The SOT MTJ device of claim 23, wherein the interlayer further comprises a silicide layer, the silicide layer comprising a material selected from a group consisting of NiSi, NiFeSi, NiFeTaSi, NiCuSi, CoSi, CoFeSi, CoFeTaSi, CoCuSi, and combinations thereof.

25. A magnetic media drive, comprising the SOT MTJ device of claim 21.

26. A magnetoresistive random access memory device, comprises the SOT MTJ device of claim 21.

27. A magnetic recording write head, comprising the SOT MTJ device of claim 21.

* * * * *